(12) United States Patent
Sasaoka et al.

(10) Patent No.: US 6,294,724 B1
(45) Date of Patent: Sep. 25, 2001

(54) SOLAR CELL MODULE AND POWER GENERATION APPARATUS

(75) Inventors: Makoto Sasaoka, Kyotanabe; Kimitoshi Fukae, Nara; Satoru Shiomi, Mishima; Hidehisa Makita, Kyotanabe; Shigenori Itoyama, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/482,863

(22) Filed: Jan. 14, 2000

(30) Foreign Application Priority Data

Jan. 14, 1999 (JP) .................................................. 11-007187
Jan. 13, 2000 (JP) .................................................. 12-004252

(51) Int. Cl.$^7$ ........................ H01L 31/048; H01L 31/042
(52) U.S. Cl. .................... 136/251; 136/244; 136/256; 136/259; 257/433; 60/641.8; 438/64; 438/66; 438/67
(58) Field of Search .................................... 136/244, 251, 136/256, 259; 257/433; 60/641.8; 438/64, 66, 67

(56) References Cited

U.S. PATENT DOCUMENTS 3,376,164 * 4/1968 Bachwansky ........................ 136/251
4,491,681 * 1/1985 Kirpich ................................ 136/246
6,063,995 * 5/2000 Bohland et al. ..................... 136/243

FOREIGN PATENT DOCUMENTS 5-29160    2/1993 (JP) .
5-291603 * 11/1993 (JP) .

* cited by examiner

Primary Examiner—Alan Diamond
(74) Attorney, Agent, or Firm—Fitzpatrick, Cella, Harper & Scinto

(57) ABSTRACT

There is disclosed a solar cell module comprising a solar cell element, a front surface member provided at the light receiving surface side of the solar cell element, and a back surface member provided at the back surface side of the solar cell element. The front surface member and the back surface member are adjoined in a releasable state. At least the front surface member and the solar cell element are in close contact or the front surface member is in close contact with a solid layer which is in close contact with the solar cell element. The solar cell element, the front surface member and the back surface member can be separated without leaving residue of any of the front surface member, the back surface member or the solid layer on the solar cell element. Thus, there is provided a solar cell module allowing for easy component separation and easy collection and classification, whereby recycling of each component, particularly of the solar cell element, is facilitated.

41 Claims, 18 Drawing Sheets

SOLAR CELL MODULE AND POWER GENERATION APPARATUS

BACKGROUND OF THE INVENTION

1. Field of the Invention

The present invention relates to a solar cell module including at least a solar cell element, a front surface member and a back surface member, and more particularly to such a solar cell module with a configuration tailored to facilitate classification, collection and recycling, and a power generation apparatus employing such a solar cell module. The present invention also relates to separating and recycling methods for such a solar cell module.

2. Related Background Art

Solar cell modules have recently been employed in various forms; for example, there is known the building material integrated type solar cell module, formed by placing a photovoltaic element on a roofing steel plate and covering the photovoltaic element with an encapsulant. Such solar cell modules may become unnecessary when the house provided with the solar cell modules as the building material is rebuilt, or the solar cell modules may have to be exchanged or replaced as the metal substrate may be corroded or the surface material at the light receiving side may be damaged after prolonged use. In disposing of such unnecessary solar cell modules, environmental contamination may result unless the components of the solar cell module are suitably separated, classified and disposed of. It is desirable, therefore, that solar cell modules be separable into their components.

Also from the ecological standpoint, it is required to separate solar cell modules into recyclable components and to recycle such components.

In the conventional solar cell module, however, it is not easy to separate the components, since the module is formed by encapsulating the solar cell element between the back surface member and the front surface member with a resinous sealant.

A solar cell module with a partially separable structure is disclosed in Japanese Patent Application Laid-open No. 5-291603. Such a solar cell module is composed of a solar cell, a solar cell holding member provided in the edge portion at the light-receiving side of the solar cell, and a container provided at the back side of the solar cell; the solar cell holding member and the container are combined with screws. The solar cell module can be separated by unscrewing into the solar cell, the solar cell holding member and the container, but the major part of the surface of the solar cell, being exposed at the outermost surface of the module, is often damaged at the surface after a certain period of use. In such a case, the recycling of the solar cell is not practical, and such a solar cell module cannot be considered satisfactory with respect to recycling potential.

Now there will be explained, with reference to FIG. 5, the current and future process for the collected solar cell module.

The "used solar cell module" that has become unnecessary, for example, by the re-building of the house in which the solar cell module is installed or the "broken solar cell module" that has become unusable by corrosion of the components or by damage on the front surface member at the light receiving side after prolonged outdoor use is "collected", for example, by collecting shops.

Conventionally processes such as "incineration", "disposal" and "dumping into ground" have been executed.

However, in consideration of the environment and the conservation of resources, there is required a process designed for recycling.

There can be conceived a recycling process consisting, after "collection" of the module, of "crushing" of the module, "classification" of the crushed products and "recycling" of the necessary materials. However, such a recycling process, though being capable of reducing the effects on the environment, is costly and is insufficient in resource saving.

Also, in most of the commercial solar cell modules, the front surface member, the back surface member, the solar cell element and the internal filter (for example, EVA) constituting such a solar cell module have respectively different service lives; the most expensive solar cell element has the longest service life in comparison with other components. For this reason, it has long been desired to extract and re-use the solar cell element alone.

SUMMARY OF THE INVENTION

An object of the present invention is to renovate the conventional configuration of the solar cell module in which the solar cell element is sealed with a resinous material and to provide a solar cell module which can be easily "disassembled" or "separated" and "classified" into individual components without "crushing" of the "collected" solar cell module and in which each "classified" component can be "re-used" after washing or other suitable processes and the "non-reusable" components can also be subjected to "recycling of material" or "conversion to new resource", whereby there is enabled a recycling process taking both "resource saving" and "influence on the environment" into consideration. The invention is particularly directed to improving the recycling property of the solar cell element and is also directed to a power generating apparatus utilizing such a solar cell module.

Another object of the present invention is to provide a separating method and a recycling method for the solar cell module mentioned above.

The above-mentioned objects can be attained, according to the present invention, by a solar cell module comprising:

a solar cell element;

a front surface member provided at the light receiving surface side of the solar cell element; and a back surface member provided at the back surface side of the solar cell element;

wherein the front surface member and the back surface member are adjoined in a releasable state;

at least the front surface member and the solar cell element are in mutual close contact or the front surface member is in close contact with a solid layer which is in close contact with the solar cell element; and the solar cell element, the front surface member and the back surface member can be separated without leaving residue of any of the front surface member, the back surface member or the solid layer on the solar cell element.

According to the present invention, there is also provided a solar cell module comprising:

a solar cell element;

a front surface member provided at the light receiving surface side of the solar cell element; and a back surface member provided at the back surface side of the solar cell element;

wherein the front surface member and the back surface member are adjoined in a releasable state;

a photocatalyst is provided at least on a face of the front surface member opposed to the solar cell element; and the solar cell element, the front surface member and the back surface member can be separated without leaving residue of any of the front surface member or the back surface member on the solar cell element.

According to the present invention, there is also provided a solar cell module comprising:

a solar cell element;

a front surface member provided at the light receiving surface side of the solar cell element;

a back surface member provided at the back surface side of the solar cell element; and an adjoining member for adjoining the front surface member and the back surface member;

wherein the front surface member and the back surface member are adjoined in a releasable state;

at least the front surface member and the solar cell element are in mutual close contact or the front surface member is in close contact with a solid layer which is in close contact with the solar cell element; and the solar cell element, the front surface member and the back surface member can be separated without leaving residue of any of the front surface member, the back surface member or the adjoining layer on the solar cell element.

According to the present invention, there is also provided a solar cell module comprising:

a solar cell element;

a front surface member provided at the light receiving surface side of the solar cell element;

a back surface member provided at the back surface side of the solar cell element; and an adjoining member for adjoining the front surface member and the back surface member;

wherein the front surface member and the back surface member are adjoined by the adjoining member in a releasable state;

a photocatalyst is provided at least on a face of the front surface member opposed to the solar cell element; and the solar cell element, the front surface member and the back surface member can be separated without leaving residue of any of the front surface member, the back surface member or the adjoining member on the solar cell element.

Still another object of the present invention is to provide a power generating apparatus including the solar cell module and an electric power converting device.

Still another object of the present invention is to provide a method of obtaining the solar cell element by separating the above-mentioned solar cell module.

Still another object of the present invention is to provide a reclaiming method for the solar cell module by utilizing at least the solar cell element, among the members obtained by separating the solar cell module, for preparing another solar cell module.

DESCRIPTION OF THE PREFERRED EMBODIMENTS

The present invention will now be clarified in detail by description of the preferred embodiments thereof.

Embodiment 1

Figure 1A:
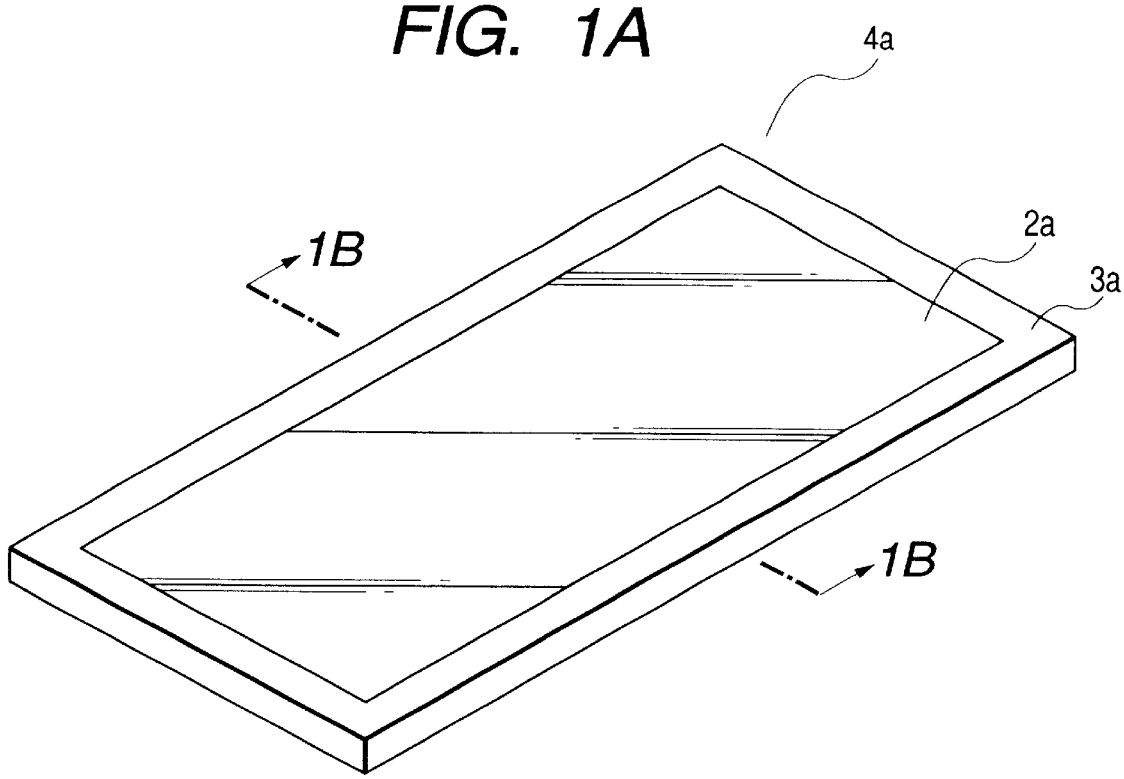
FIGS. 1A, 1B, 2A, 2B, 3A, 3B, 3C, 4A, and 4B are schematic views showing schematic configurations of solar cell modules of preferred embodiments of the present invention.
Figure 1B:
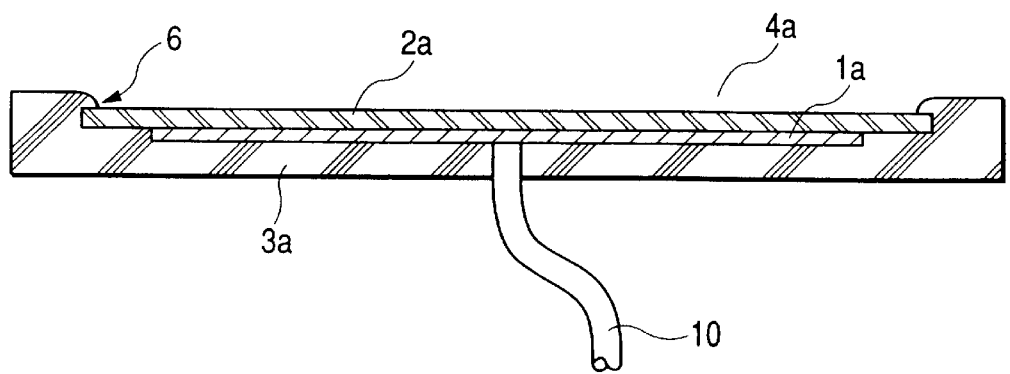

FIGS. 1A and 1B are schematic views showing an example of the solar cell module comprising:

a solar cell element;

a front surface member provided at the light receiving surface side of the solar cell element; and a back surface member provided at the back surface side of the solar cell element;

wherein the front surface member and the back surface member are adjoined in a releasable state;

at least the front surface member and the solar cell element are in mutual close contact or the front surface member is in close contact with a solid layer which is in close contact with the solar cell element; and the solar cell element, the front surface member and the back surface member can be separated without leaving residue of any of the front surface member, the back surface member or the solid layer on the solar cell element. FIG. 1A is a schematic perspective view seen from the side of the light receiving surface, while FIG. 1B is a schematic cross-sectional view along a line 1B—1B in FIG. 1A.

In the present embodiment, after a solar cell element 1a is provided on a back surface member 3a, a front surface member 2a is superposed thereon so as to be in close contact with the solar cell element 1a. Then the front surface member 2a and the back surface member 3a are adjoined in a releasable manner to obtain the solar cell module 4a.

The solar cell element 1a is connected to an end of a lead wire 10, the other end of which is guided to the exterior of the solar cell module 4a to constitute an output terminal.

In the solar cell module of the present embodiment, the solar cell element is not resin encapsulated as in the conventional solar cell module, but is in close contact with the front surface member, so that the external force applied to the solar cell module may be transmitted through the front surface member to the solar cell element, thereby eventually causing destruction thereof. Consequently, it is preferred to employ a countermeasure against such external pressure.

Also even if the applied pressure is not of a level causing the destruction of the solar cell element, friction may be induced between the contacting surfaces of the front surface member and the solar cell element resulting in deterioration of performance, such as loss of optical transmittance of the front surface member or of the surface of the solar cell element. It is preferred to employ a countermeasure against such a phenomenon. It is preferred to design the module in consideration of such a phenomenon, particularly in a case where the solar cell element is composed of a crystalline silicon solar cell element of the substrate-less type which is susceptible to pressure or distortion.

A specific countermeasure against the pressure will be explained later.

Also since the solar cell module of the present invention does not employ resin encapsulation as in the conventional solar cell module, it is preferable to employ waterproof means in various parts. Specific waterproof means will be explained later.

Also in the present embodiment, a gap 6 is provided between the front surface member and the back surface member, and the adjoining can be easily released, for example, by inserting a screwdriver or the like into such a gap.

In the solar cell module of the above-described configuration, the solar cell element is sandwiched between the front surface member and back surface member, but not adhered thereto, so that the front surface member, the solar cell element and the back surface member can be easily classified. Consequently, there can be provided a solar cell module of a low manufacturing cost and satisfactory classifying/collecting properties.

Also in the above-described embodiment, the front surface member and the back surface member are adjoined by the mutual shapes thereof without employing a separate adjoining member. Consequently, the number of components can be reduced, while the manufacturing cost can be lowered due to the reduced cost for managing the components. Further, the classification/collection property is satisfactory since, after the collection, there can be reduced the costs for disassembling, separation and classification.

Also the above-described configuration is suitable for re-use, because the residue of the front surface member or the back surface member does not remain on the solar cell element at the disassembling, separation and classification.

Also in the above-described configuration, the front surface member and the solar cell element are in close contact to avoid light reflection at the interface therebetween, thereby suppressing the loss in the power generation efficiency of the solar cell module. It is also possible to prevent moisture condensation between the front surface member and the photovoltaic element.

When a gas layer is present between the front surface member and the solar cell element, the temperature of the solar cell element may be elevated by the greenhouse effect, thereby leading to an evident loss of the output where the solar cell element is composed of crystalline silicon semiconductor. However, the configuration in which the front surface member and the solar cell element are in close contact can minimize the output loss even where a crystalline silicon semiconductor is employed in the solar cell element.

Embodiment 2

Figure 2A:
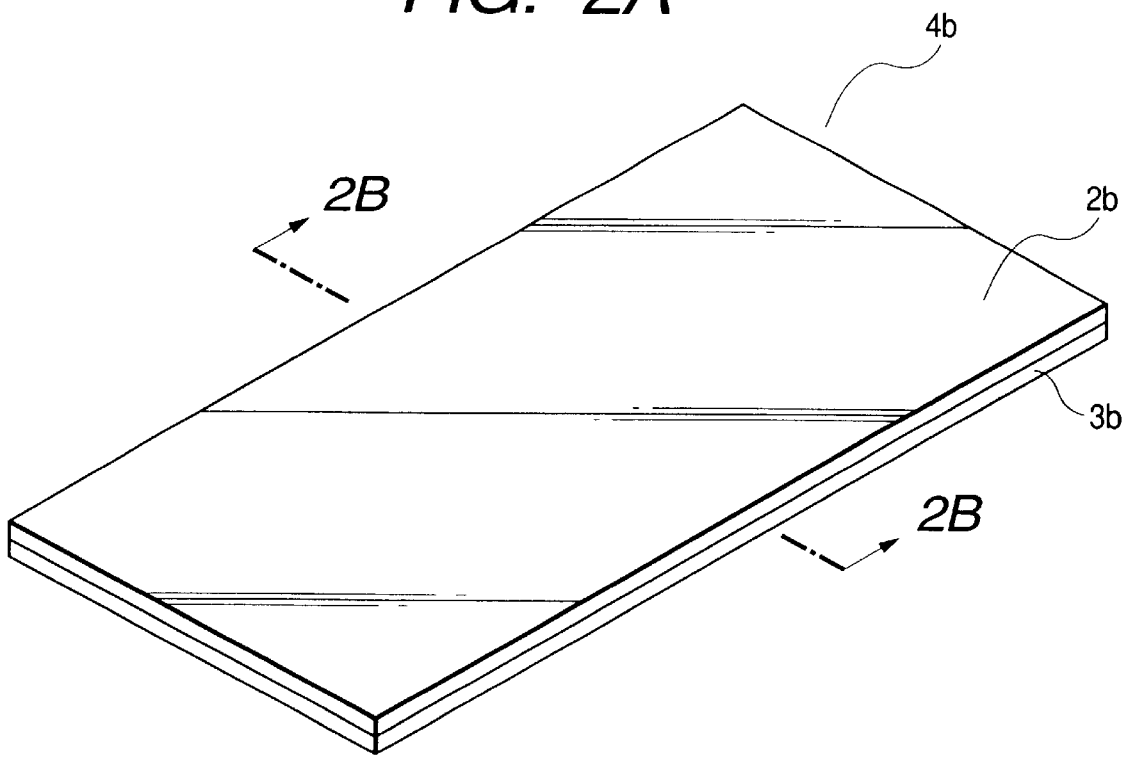
Figure 2B:
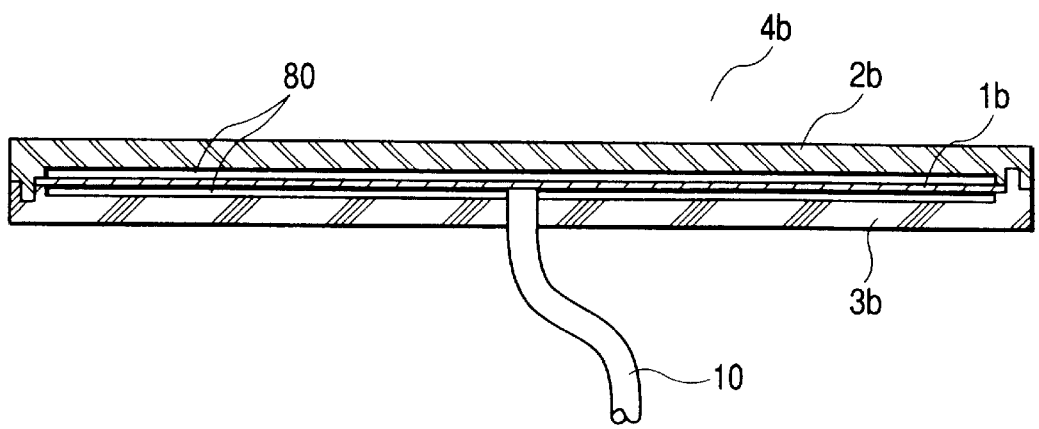

FIGS. 2A and 2B are schematic views showing a solar cell module 4b comprising:

a solar cell element;

a front surface member provided at the light receiving surface side of the solar cell element; and a back surface member provided at the back surface side of the solar cell element;

wherein the front surface member and the back surface member are adjoined in a releasable state;

a photocatalyst is provided at least on a face of the front surface member opposed to the solar cell element; and the solar cell element, the front surface member and the back surface member can be separated without leaving residue of any of the front surface member or the back surface member on the solar cell element. FIG. 2A is a schematic perspective view seen from the side of the light receiving surface, and FIG. 2B is a schematic cross-sectional view along a line 2B—2B in FIG. 2A.

In the present embodiment, after a solar cell element 1b is provided on a back surface member 3b, a front surface member 2b is superposed thereon. Then, the front surface member 2a and the back surface member 3a are adjoined in a releasable manner to obtain the solar cell module 4b. The solar cell element 1b is connected to an end of a lead wire 10, of which the other end is guided to the exterior of the solar cell module 4b to constitute an output terminal.

In the solar cell module of the present embodiment, the solar cell element is not resin encapsulated as in the conventional solar cell module; it has an air layer 80 inside the solar cell module, so that moisture condensation may result inside the solar cell module. Consequently, as a countermeasure against the moisture condensation, a photocatalyst is provided on a surface of the front surface member opposed to the solar cell element. In the present embodiment, it is preferred to also employ other countermeasures against the moisture condensation.

Also as the solar cell module of the present embodiment has a gas layer 80 between the front surface member 2b and the solar cell element 1b, there may result light reflection on the surface of the front surface member 2b when the front surface member 2b and the gas layer 80 have a large difference in refractive index. Consequently, an anti-reflective treatment is preferably applied to the front surface member.

Also since the solar cell module of the present invention does not employ resin encapsulation as in the conventional solar cell module, it is preferable to employ waterproof means in various parts.

In the solar cell module of the above-described configuration, the front surface member and the back surface member are adjoined in a releasable manner, and the solar cell element is merely supported by the front surface member and back surface member but not adhered thereto, so that the front surface member, the solar cell element and the back surface member can be easily classified. Consequently, there can be provided a solar cell module of a low manufacturing cost and satisfactory classifying/collecting potential.

Also in the above-described embodiment, the front surface member and the back surface member are adjoined by the mutual shapes thereof without employing a separate adjoining member. Consequently, the number of components can be reduced, while the manufacturing cost can be lowered due to the reduced cost for managing the components. Further, the classification/collection property is satisfactory since, after the collection, there can be reduced the costs for disassembling, separation and classification.

Also the above-described configuration is suitable for re-use because the residue of the front surface member or the back surface member does not remain on the solar cell element at the disassembling, separation and classification.

Also in the above-described configuration, the front surface member and the solar cell element are preferably formed with the same shape and with the same material. In this manner, the front surface member and the back surface member can be prepared with the same molding machine to reduce the manufacturing cost of the solar cell module and to improve the recycling property after classification and collection.

In the above-described embodiment, photocatalyst causing superhydrophilicity by solar light irradiation is provided on the surface of the front surface member opposed to the solar cell element, so that, even when condensation is present between the front surface member and the solar cell element, the photocatalyst is excited by the solar light irradiation to induce superhydrophilicity on the back surface of the front surface member, whereby the moisture condensed thereon forms a uniform water film to ensure the light transmittance of the front surface member.

In the above-described configuration, the photovoltaic part of the solar cell element is separated from the front surface member so that the external force applied to the solar cell module is not transmitted to the solar cell element through the front surface member. Consequently, the electric performance of the solar cell module can be secured even without any particular countermeasure against the pressure.

Also in the above-described configuration, a gas layer is present between the front surface member and the solar cell element to elevate the temperature thereof by the greenhouse effect, thereby suppressing photodegradation and obtaining an annealing effect when amorphous silicon semiconductor is employed in the solar cell element.

Also in the above-described configuration, the solar cell module itself constitutes a heat insulating structure, thereby providing a roofing material or the like of high heat insulating effect by employing such a solar cell module in the roofing material or the like.

Embodiment 3

Figure 3A:
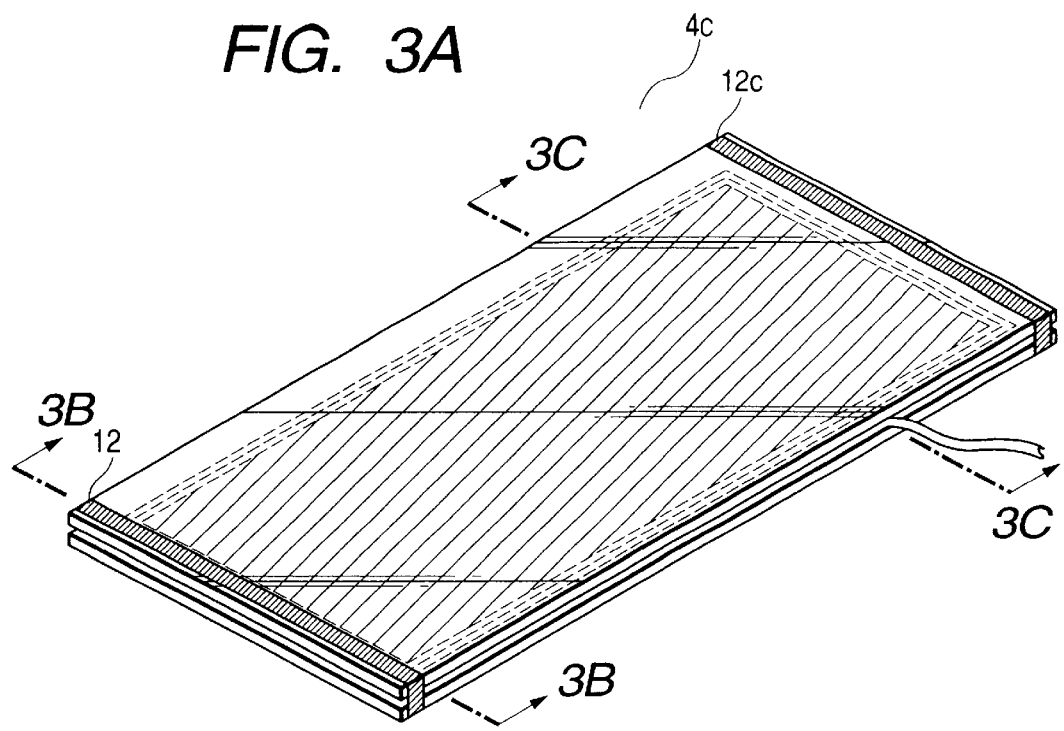
Figure 3B:
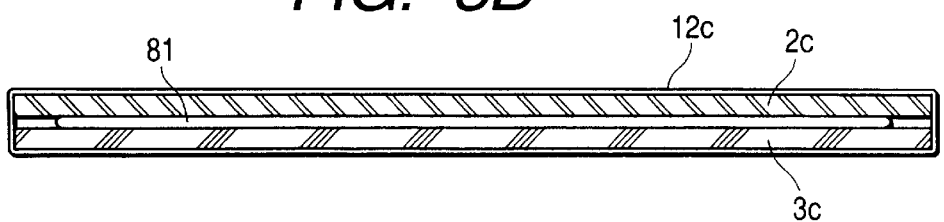
Figure 3C:
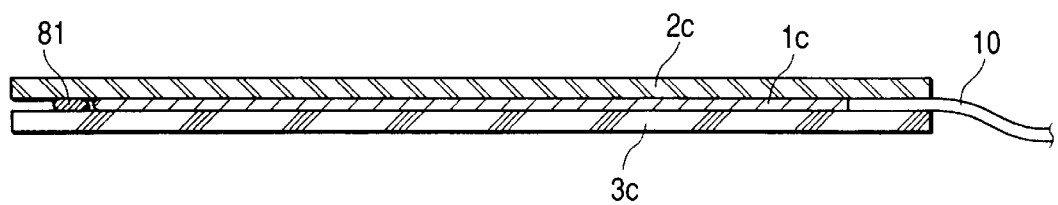

FIGS. 3A, 3B and 3C show a solar cell module 4c comprising:

a solar cell element;

a front surface member provided at the light receiving surface side of the solar cell element;

a back surface member provided at the back surface side of the solar cell element; and an adjoining member for adjoining the front surface member and the back surface member;

wherein the front surface member and the back surface member are adjoined in a releasable state;

at least the front surface member and the solar cell element are in mutual close contact or the front surface member is in close contact with a solid layer which is in close contact with the solar cell element; and the solar cell element, the front surface member and the back surface member can be separated without leaving residue of any of the front surface member, the back surface member, the adjoining layer or the solid layer on the solar cell element. FIG. 3A is a schematic perspective view seen from the side of the light receiving surface, FIG. 3B is a schematic cross-sectional view along a line 3B—3B in FIG. 3A, and FIG. 3C is a schematic cross-sectional view along a line 3C—3C in FIG. 3A.

In the present embodiment, after a solar cell element 1c is provided on a back surface member 3c, a front surface member 2c is superposed thereon so as to be in close contact with the solar cell element 1c. Then the front surface member 2c and the back surface member 3c are adjoined with the adjoining member 12c in a releasable manner to obtain the solar cell module c.

The solar cell element 1c is connected to an end of a lead wire 10, of which the other end is guided to the exterior of the solar cell module c to constitute an output terminal.

Also since the solar cell module of the present invention does not employ resin encapsulation as in the conventional solar cell module, it is preferable to employ waterproof means 81 in various parts.

In the solar cell module of the present embodiment, the solar cell element is not resin encapsulated as in the conventional solar cell module but is in close contact with the front surface member, so that the solar cell element is preferably provided with a countermeasure against such external pressure, for the reason explained in Embodiment 1.

In the solar cell module of the above-described configuration, the solar cell element is sandwiched between the front surface member and the back surface member, but not adhered thereto, so that the front surface member, the solar cell element and the back surface member can be easily classified. Consequently, there can be provided a solar cell module of a low manufacturing cost and satisfactory classifying/collecting property.

Also in the above-described configuration, the front surface member and the back surface member are adjoined by the adjoining member in a releasable manner, so that the front surface member and the back surface member do not need the engaging portions for mutual adjoining, and each of the front surface member and the back surface member can be formed into a simple shape obtained by cutting a flat plate into a predetermined size. For this reason, it is possible to form the plate material by extrusion molding at the manufacture to reduce the manufacturing cost. Also depending upon the configuration, it is also rendered possible to employ a general-purpose plate material for the front or back surface member and to employ a general-purpose roofing material for the back surface member, thereby further reducing the manufacturing cost.

Also the flat plate shape of the front and back surface members improves the recycling property after classification. The recycling property can also be improved by employing the same material for the front surface member and the back surface member.

Also the above-described configuration is suitable for re-use since the residue of the front surface member or the back surface member does not remain on the solar cell element.

Also in the above-described configuration, the front surface member and the solar cell element are in close contact to avoid light reflection at the interface therebetween, thereby suppressing the loss in the power generation efficiency of the solar cell module. It is also possible to prevent moisture condensation between the front surface member and the photovoltaic element.

When a gas layer is present between the front surface member and the solar cell element, the temperature of the solar cell, element may be elevated by the greenhouse effect, thereby leading to an evident loss of the output where the solar cell element is composed of crystalline silicon semiconductor. However, the configuration in which the front surface member and the solar cell element are in close contact can minimize the output loss even where the crystalline silicon semiconductor is employed in the solar cell element.

Embodiment 4

Figure 4A:
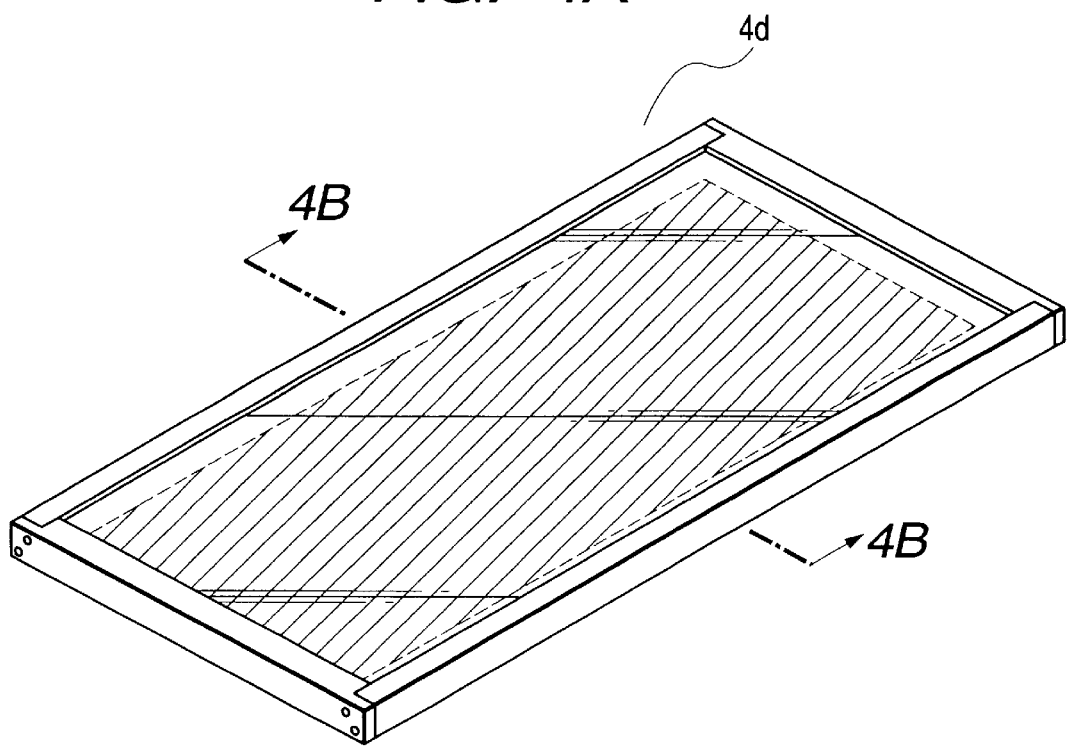
Figure 4B:
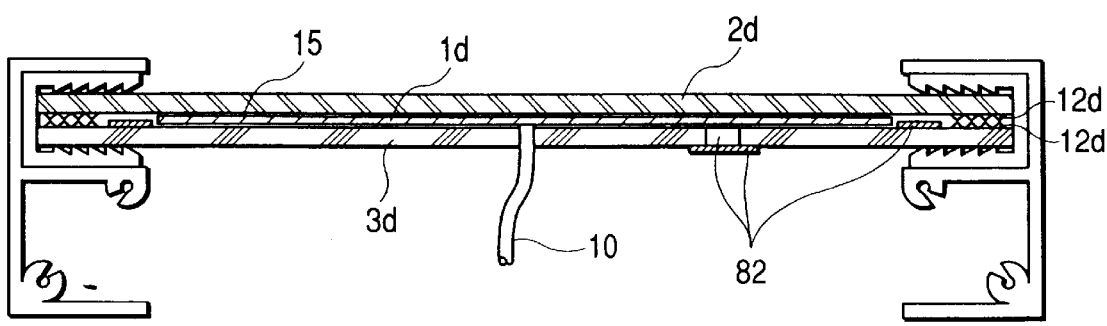
Figure 5:
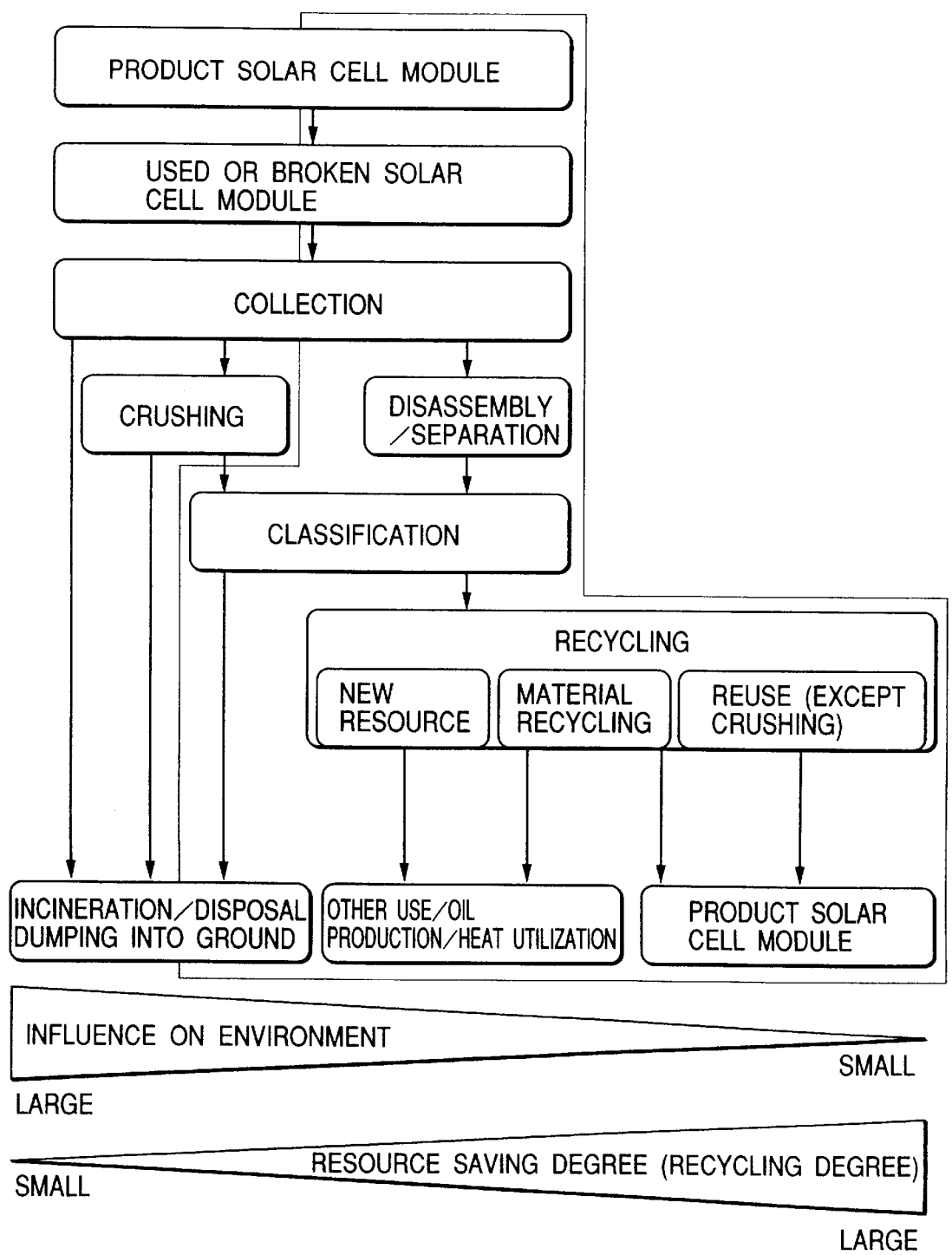
FIG. 5 is a view showing a recycling cycle for the solar cell module embodying the present invention.

FIGS. 4A and 4B show a solar cell module comprising:

a solar cell element;

a front surface member provided at the light receiving surface side of the solar cell element;

a back surface member provided at the back surface side of the solar cell element; and an adjoining member for adjoining the front surface member and the back surface member;

wherein the front surface member and the back surface member are adjoined by the adjoining member in a releasable state;

a photocatalyst is provided at least on a face of the front surface member opposed to the solar cell element; and the solar cell element, the front surface member and the back surface member can be separated without leaving residue of any of the front surface member, the back surface member or the adjoining member on the solar cell element. FIG. 4A is a schematic perspective view seen from the side of the light receiving surface, and FIG. 4B is a schematic cross-sectional view along a line 4B—4B in FIG. 4A.

In the present embodiment, a solar cell element 1d is sandwiched between a front surface member 2d and a back surface member 3d with a spacer 15 therebetween, and the front surface member 2d and the back surface member 3d are fixed with an adjoining member 15.

In the present embodiment, the light non-receiving area of the solar cell element 1d is supported by the spacer 15, whereby the solar cell element 1d is positioned in a hollow space between the front surface member 2d and the back surface member 3d. The spacer 15 also functions as the countermeasure against pressure.

In the present embodiment, after a solar cell element 1d is provided on a back surface member 3d, a front surface member 2d is superposed thereon. Then the front surface member 2d and the back surface member 3d are adjoined with the adjoining member 12 in a releasable manner to obtain the solar cell module 4d.

The solar cell element id is connected to an end of a lead wire 10, of which the other end is guided to the exterior of the solar cell module 4b to constitute an output terminal.

In the solar cell module of the present embodiment, the solar cell element is not resin encapsulated as in the conventional solar cell module; it has an air layer inside the solar cell module, so that moisture condensation may result inside the solar cell module. Consequently, as a countermeasure 82 against the moisture condensation, a photocatalyst is provided on a surface of the front surface member opposed to the solar cell element. In the present embodiment, it is preferred to also employ other countermeasures against the moisture condensation.

Also as the solar cell module of the present embodiment has a gas layer between the front surface member 2d and the solar cell element 1d, there may result light reflection on the surface of the front surface member 2d when the front surface member 2d and the gas layer have a large difference in refractive index. Consequently, an anti-reflective treatment is preferably applied to the front surface member.

Also since the solar cell module of the present invention does not employ resin encapsulation as in the conventional solar cell module, it is preferable to employ waterproof means in various parts.

In the solar cell module of the above-described configuration, the solar cell element is merely supported by the front surface member and back surface member but not adhered thereto, so that the front surface member, the solar cell element and the back surface member can be easily classified. Consequently, there can be provided a solar cell module of a low manufacturing cost and satisfactory classifying/collecting property.

Also in the above-described configuration, the front surface member and the back surface member are adjoined by the adjoining member in a releasable manner, so that the front surface member and the back surface member do not need the engaging portions for mutual adjoining, and each of the front surface member and the back surface member can be formed into a simple shape obtained by cutting a flat plate into a predetermined size. For this reason, it is possible to form the plate material by extrusion molding at the manufacture to reduce the manufacturing cost. Also depending upon the configuration, it is also rendered possible to employ a general-purpose plate material for the front or back surface member and to employ a general-purpose roofing material for the back surface member, thereby further reducing the manufacturing cost.

Also the flat plate shape of the front and back surface members improves the recycling property after classification. The recycling property can also be improved by employing the same material for the front surface member and the back surface member.

Also the above-described configuration is suitable for re-use since the residue of the front surface member or the back surface member does not remain on the solar cell element.

In the above-described embodiment, photocatalyst causing supery drophilicity by solar light irradiation is provided on the surface of the front surface member opposed to the solar cell element, so that, even when condensation is present between the front surface member and the solar cell element, the photocatalyst is excited by the solar light irradiation to induce superhydrophilicity on the back surface of the front surface member, whereby the moisture condensed thereon forms a uniform water film to ensure the light transmittance of the front surface member.

In the above-described configuration, the photovoltaic part of the solar cell element is separated from the front surface member so that the external force applied to the solar cell module is not transmitted to the solar cell element through the front surface member. Consequently, the electric performance of the solar cell module can be secured even without any particular countermeasure against the pressure.

Also in the above-described configuration, a gas layer is present between the front surface member and the solar cell element to elevate the temperature thereof by the greenhouse effect, thereby suppressing photodegradation and obtaining an annealing effect when amorphous silicon semiconductor is employed in the solar cell element.

Also in the above-described configuration, the solar cell module itself constitutes a heat insulating structure, thereby providing a roofing material or the like of high heat insulating effect, by employing such a solar cell module in the roofing material or the like.

The solar cell module described in Embodiments 1 to 4 does not have the resin encapsulated configuration as in the conventional solar cell module. There can be employed a noncombustible, semi-noncombustible or flame-retardant material for the front surface member or the back surface member to significantly reduce the absolute amount of the inflammable material in the solar cell module, thereby providing a solar cell module with significantly improved fireproof performance.

Also even when the front surface member is damaged after prolonged use and light transmittance has deteriorated as a result, the initial light transmittance can be restored by employing a transparent component for at least the front surface member and replacing such a front surface member. Also after the use of the solar cell module for the predetermined service life, the solar cell element, front surface member and back surface member can be easily classified and separated, whereby excellent recycling potential can be obtained.

In the following, there will be given a detailed explanation on the members constituting the solar cell modules described in the foregoing embodiments.

Solar Cell Element 1

The solar cell element 1 (1a to 1d) employed in the present invention is not particularly limited and can be composed, for example, of silicon semiconductor or a compound semiconductor. Among the silicon semiconductor, there can be employed monocrystalline silicon, polycrystalline silicon, microcrystalline silicon or amorphous silicon.

Also for obtaining desired voltage and current, plural solar cell elements may be connected in series and/or parallel within the solar cell module.

On the other hand, when a single solar cell element is employed in the solar cell module, there can be dispensed with the mutual connection between the solar cell elements to avoid surface irregularity in the connection, thereby avoiding stress concentration resulting from such surface irregularity in sandwiching the solar cell element between the front surface member and the back surface member.

Also such a single solar cell element provides a lower output voltage, but there can be reduced the influence of shortcircuiting caused by eventual water intrusion into the solar cell module.

Also the solar cell element of the substrate-less type, the solar cell element provided on a stainless steel substrate or a glass substrate or the wafer type solar cell element, being used in a state covered with the front surface member, is free from external damage and can often be re-used after classification.

Front Surface Member 2

The front surface member 2 (2a to 2d) is required to have light transmittance and is preferably weather resistant and resistant to smear deposition.

It can be advantageously composed of light transmissive glass or organic resin.

In case of glass, the kind of the glass is not particularly limited, but tempered glass with a low ion content is preferred in consideration of transmittance of light in the blue color region and mechanical strength.

In case of organic resin, the kind of such resin is not particularly limited, but there is preferred fluororesin such as polyethylene tetrafluoroethylene (ETFE), polytrifluoroethylene or polyvinyl fluoride, acrylic resin, polycarbonate resin or silicone resin, in consideration of the light transmittance, weather resistance and resistance to smear deposition.

Also thermoplastic resin, which can be returned to the original material by heating, is superior in recycling property after classification, to the thermosetting resin which cannot be returned to the original material by heating, and the front surface member composed of such thermoplastic resin can be crushed and pelletized for re-use as raw material.

Also the front surface member, the back surface member and other members may be composed of thermoplastic resin of the same kind to improve the efficiency of classifying work. The efficiency of classifying work can also be improved by attaching a mark, indicating the material, such as an internationally unified standard, in a part of the front surface member.

Furthermore, an additive such as an ultraviolet absorbing agent may be added to the above-mentioned material to suppress the deterioration of the material constituting the members of the solar cell module.

Also at least the gap between the front surface member 2 and the solar cell element 1 may be filled with an inert gas to prevent deterioration such as oxidation of the front surface member, solar cell element or back surface member, thereby improving the durability.

In order to improve the strength of the solar cell module by the front surface member 2, there may be selected a front surface member having a suitable thickness and shape matching the desired strength.

As the front surface member is mechanically fixed to the back surface member, the material or structure is preferably selected in consideration of the linear expansion coefficient of the back surface member 3 and the solar cell element 1.

Back Surface Member 3

The back surface member 3 (3a to 3d) is not particularly limited and can be composed of metal, organic resin or ceramics. There can be naturally employed slate or the like ordinarily employed as the roofing material. Also there can be employed a composite material composed of plural materials.

In case of organic resin, thermoplastic resin, which can be returned to the original material by heating, is superior in recycling property after classification, to the thermosetting resin which cannot be returned to the original material by heating, and the back surface member composed of such a thermoplastic resin can be crushed and pelletized for re-use as the raw material.

Also the back surface member may be composed of thermoplastic resin of the same kind as that for the front surface member and other members to improve the efficiency of classifying work. The efficiency of classifying work can also be improved by attaching a mark, indicating the material, such as an internationally unified standard, in a part of the back surface member.

In order to improve the strength of the solar cell module by the back surface member 3, there may be selected a front surface member having a suitable thickness and shape matching the desired strength.

As the back surface member is mechanically fixed to the front surface member, the material or structure is preferably selected in consideration of the linear expansion coefficient of the front surface member 2 and the solar cell element 1.

Also, since the back surface of the solar cell element 1 is mostly electroconductive, the back surface member 3 is preferably composed of an insulating material.

Such effect ce,n, however, be obtained also by providing an insulating sheet between the back surface member 3 and the solar cell element 1, and such method is effective when the back surface member is composed of a metal such as a steel plate.

Furthermore, the back surface member 3 may be composed of an elastic material, in order to improve the holding of the solar cell element 1 and the water tightness of the solar cell module, to simplify the adjoining structure with the front surface member and to eliminate the gas layer present between the back surface member 3 and the solar cell element 1 and inducing moisture condensation.

Such effects can also be obtained by providing an elastic member between the back surface member 3 and the solar cell element 1.

Lead Wire 10

The lead wire 10 to be employed in the present invention is not particularly limited and can be suitably selected from the materials having heat resistance, low temperature resistance, mechanical strength, electrical insulation, water resistance, oil resistance, abrasion resistance, acid resistance, alkali resistance, etc. required in the conditions of use. For example, there can be advantageously employed a wire insulated with IV, KIV, HKIV, crosslinked polyethylene, fluororubber, silicone rubber, fluororesin, etc. In addition to such wire, there may also be employed a copper tab or a copper wire as the lead wire.

The lead wire of a cable structure is desirable where scar resistance or abrasion resistance is strongly desired.

More specifically, there can be employed the 600V polyethylene insulated cable (EV, EE, CV, CE) of JIS C3605 standard, the 600V grade EP rubber insulated cable (PN, PV) of JIS C3621 standard, the 600V grade polyvinyl chloride insulated and sheathed (flat type) cable (VVR, VVF) of JIS C3342 standard, the class 1, 2, 3 or 4 600V rubber insulated cabtyre cable (1CT, 2CT, 3CT, 4CT) of JIS C3327 standard, the class 2, 3 or 4 rubber 600V insulated chloroprene cabtyre cable (2RNCT, 3RNCT, 4RNCT) of JIS C3327 standard, the class 2, 3 or 4 EP rubber insulated chloroprene cabtyre cable (2PNCT, 3PNCT, 4PNCT) of JIS C3327 standard or the 600V grade polyvinyl chloride insulated and sheathed vinyl cabtyre cable of JIS C3312 standard.

Output Terminal

The output terminal portion (where the lead wire is guided to the exterior of the module) to be employed in the present invention is not particularly limited, but is required to guide the output of the solar cell element to the exterior of the solar cell module securely and reliably over a prolonged period. For this reason, there is preferably employed a member satisfactory in moisture resistance, water resistance, electric insulation, weather resistance, heat resistance, low temperature resistance, oil resistance, flame retardancy and mechanical strength.

More specifically, the above-mentioned requirements are preferably satisfied by connecting the lead wire to the solar cell element and covering the connecting portion with a sealing member or a terminal box.

Also the member to be employed as the output terminal, in order to constitute a part of the solar cell module excellent in the classification/collection property and recycling property, is preferably composed of a member satisfactory in the classification/collection property and recycling property.

More specifically, the connection between the solar cell element and the lead wire can be achieved by soldering the take-out electrode of the solar cell element with the lead wire, and, at the disassembling and separation of the solar cell module, the soldered portion can be re-heated, whereby the solar cell module can be easily classified into the solar cell element and the lead wire.

More preferably, there may be employed a structure of making the electric connection by contact of the take-out electrode of the solar cell element with an end of the lead wire, thereby dispersing with the soldering operation at the assembling and the reheating at the disassembling/separation, thus providing the output terminal of superior recycling property.

More specifically, a unit provided with an engaging portion with the electrode is prepared at the end of the lead wire, and such a unit is made to engage the back surface member of the solar cell module, whereby the electrode of the solar cell element in the solar cell module comes into contact with the output terminal to easily achieve electrical connection.

In such a configuration, the materials of the output electrode and the electrode are not particularly restricted, but the contact portion, realizing electrical connection by contact, is required to ensure the electrical performance over a prolonged period. For this reason, there are preferably employed members satisfactory in corrosion resistance, contact resistance, bendability, spring characteristics, extendibility and abrasion resistance. For example, there can be advantageously employed a copper alloy such as brass, phosphor bronze, beryllium copper, titanium copper or oxygen-free copper. Also the contact portion between the output terminal and the electrode may form a film by oxidation or sulfination. Therefore, except for the application for a strong current that can break such a film, it is preferable to apply precious metal plating such as of gold or palladium or tin plating directly on the copper alloy, and to apply nickel plating as an intermediate film on the copper alloy, for the purpose of preventing mutual diffusion and improving hardness of the contact and abrasion resistance.

In addition to the aforementioned structures, it is also possible to form the take-out electrode of the solar cell element as a tab protruding on the lateral face thereof, to contact the end of the lead wire with such a tab and to connect the contacting portions by resistance welding or ultrasonic welding, thereby easily and securely attaining the electrical connection. Also at the disassembling/separation, such a welded portion can be cut off to achieve easy classification of the solar cell element without thermal influence thereto.

The output terminal mentioned above may be provided on the light receiving surface, light nonreceiving surface or lateral face of the solar cell module.

Adjoining Member

The adjoining member to be employed in the present invention is riot particularly limited but is preferably capable of easily adjoining the front surface member and the back surface member and of easily releasing the adjoining.

The easy adjoining and releasing of the front surface member and the back surface member allow to classify the front surface member, the solar cell element and the back surface member, whereby provided is the solar cell module allowing easy classification and collection.

Also a structure where the front surface member and the back surface member are easily released by cutting or breaking the adjoining member is effective enough since other members can be easily classified and collected.

In the following, there will be explained preferred examples of the adjoining member.

Screw, Bolt and Nut, Joint

The material for such adjoining members is not particularly limited, but is preferably provided with satisfactory weather resistance and strength.

In consideration of the recycling property, there is preferred a material which is the same as that of the front or back surface member, is mutually soluble therewith or is magnetically classifiable. Also there has to be considered the corrosion in contact with the front or back surface member.

When the adjoining member is composed of the same material as the front or back surface member or a material mutually soluble therewith, at least a part of the adjoining member is fixed to and remains with that same or mutually soluble material upon classification and collection of the solar cell module components, whereby the classifying and collecting properties are improved.

There may also be employed a configuration in which the adjoining member is provided in a part thereof with a portion that can be easily cut, for example, with nippers, and the adjoining can be released by cutting off such a portion.

The present adjoining method has the following advantages. This method, not requiring the adhesive force for the adjoining, can be applied to the front and back surface members of any material. It can also be easily applied to various forms since it is not affected by the shape and size of the front and back surface members. Also when employing a bolt and nut, they can be easily obtained from the commercially available ones even if they are broken or deteriorated at the site of installation, so that there can be attained satisfactory maintenance property.

Two-Sided Adhesive Tape

The two-sided adhesive tape is not particularly limited in material or structure, but is preferably provided with weather resistance, strength, waterproofness and electrical insulating property. Also in consideration of the recycling property, it is preferably composed of a material which is mutually soluble with that of the front or back surface member. In such a case, it is more preferable to use an adhesive tape with controlled adhesive forces on both sides in such a manner that, at the disassembling of the solar cell module, one of the adhesive faces remains fixed to the side of the mutually soluble material while the other of the adhesive faces is peeled at the interface, thereby improving the classifying/collecting property.

The present adjoining method has the following advantages. This adjoining method does not require additional work such as hold formation in the front and back surface members, thereby reducing the cost in such members. It is also applicable to a material that is hard to work. Furthermore, as the front and back surface members are adjoined by adhesion, the adjoining can be achieved without retentive stress in the front and back surface members. It can also be utilized as the waterproof means, for example, by attaching a waterproof two-sided adhesive tape so as to surround the periphery of the solar cell element, thereby ensuring the waterproof property on the lateral faces of the solar cell module. In the use of the two-sided adhesive tape, the adhesive face of the tape is preferably maintained away from the solar cell element.

Fasteners

In the use of fasteners, they are mounted in advance respectively on the mutually opposed surfaces of the front and back surface members, and the front and back surface members are fixed by mutually engaging the fasteners. The fixing of the fastener with the front or back surface member can be achieved not only by the two-sided adhesive tape mentioned above but also by various methods such as fitting, fusion or integral molding. In such a case, there is required designing in consideration of the classifying and recycling properties of the front or back surface member and the fastener.

The fasteners are not particularly limited in material or structure, but are preferably provided with weather resistance and strength. Also in consideration of the recycling property, it is preferably composed of a material which is mutually soluble with that of the front or back surface member.

When employing a material that is the same as or mutually soluble with the material of the front or back surface member, there is employed a configuration where at least a part of the adjoining member remains fixed with that same or mutually soluble material upon classification and collection of the solar cell module components, thereby improving the classifying and collecting properties.

An example of the fasteners is the Dual Lock Fastener manufactured by Sumitomo 3M Co.

The present adjoining method has the following advantages. This adjoining method does not require additional work such as hold formation in the front and back surface members, thereby reducing the cost of such members. It is also applicable to a material that is hard to work.

Furthermore, as the front and back surface members are adjoined by fastening, the adjoining can be achieved without retentive stress in the front and back surface members. Also adjoining by fasteners allows easy re-adjoining when the front surface member and the back surface member are positionally aberrated in the manufacturing process or at the replacement of the front or back surface member.

Belt, Band

A belt can be used for mutually fixing the front and back surface members by collective binding. There is preferred a structure allowing arbitrary tightening and arbitrary loosening, but a belt structure that cannot be easily loosened after tightening can be effective enough if the belt can be easily cut.

A band can be used, like the belt, for mutually fixing the front and back surface members by collective binding. It preferably has suitable stretchability and elasticity, as in a rubber band, and is preferably composed of silicone rubber or EPD rubber in consideration of outdoor use.

The adjoining with a belt or a band provides the advantage that the front and back surface members can be formed into simple shapes such as a flat rectangular shape, because holes or the like for mounting the adjoining member are not required in the front and back surface members, thereby improving the manufacturing cost, classification/collection property and recycling property.

This adjoining method does not require additional work such as hold formation in the front and back surface members, thereby reducing the cost in such members.

This method, not requiring the adhesive force for the adjoining, can be applied to the front and back surface members of any material. Furthermore, this method enables easy adjoining by a member capable of easy adjoining such as a band, without tightening torque management required in the case of the bolt and nut or without complex process management on the pressure and pressing time required in the case of the two-sided adhesive tape.

Cap

A cap is fitted on an end of the front and back surface members after they are mutually superposed, thereby mechanically fixing the front and back surface members.

The cap can be composed of a metal or a resinous material, preferably with weather resistance.

There may also be employed a double-cap structure of fitting a rubber cap on the superposed front and back surface members and fitting an aluminum frame thereon.

The present adjoining method has the following advantages. This adjoining method does not require additional work such as hold formation in the front and back surface members, thereby reducing the cost in such members.

Also this method, not requiring the adhesive force for the adjoining, can be applied to the front and back surface members of any material. Furthermore, this method enables easy adjoining, without tightening torque management required in the case of the bolt and nut or without complex process management on the pressure and pressing time required in the case of the two-sided adhesive tape.

Furthermore, the cap, being a member to be attached later, can be modified in shape, and a part of the cap can be utilized as a member for fixing on the roof.

When the adjoining member is not employed, the front and back surface members preferably have such structures for realizing physical fitting.

Waterproof Means 12

The waterproof means to be employed in the present invention is required to prevent deterioration in the electric performance and insulating performance of the solar cell module and physical properties of the components thereof, caused by water intrusion from the exterior of the solar cell module.

As regards the waterproof means, there are required waterproof properties of the solar cell element itself and that of the solar cell module.

More specifically, there can be employed a transparent waterproof film or a solid layer for improving the waterproof property of the solar cell element itself, and there can be employed a water stopping material, a bushing or a groove for improving the waterproof property of the entire solar cell module.

In the following, there will be explained examples of the waterproof means.

Transparent Waterproof Film

A transparent waterproof film is coated and dried on the surface of the solar cell, thereby preventing entry of water from the front surface of the solar cell element.

The transparent waterproof film is not particularly limited in the material thereof, but is preferably provided with excellent moisture resistance, light transmittance and electrical insulation. There can be utilized resinous material principally composed of acrylic resin, silicone resin or fluorinated resin.

Solid Layer

A solid layer is sandwiched between the solar cell element and the front surface member and is in close contact with the surface of the solar cell element, thereby protecting the surface thereof from the moisture.

The material of the solid layer is preferably provided with excellent weather resistance, insulating property and light transmittance, and, more preferably, is suitably elastic, chemically inert and of a high melting point.

Examples of such material include silicon rubber, fluorinated rubber, acrylic rubber, urethane resin and ethylenic copolymer (EVA, etc.).

The ethylenic copolymer can be improved in the light transmittance by crosslinking in advance. In addition to such elastic solid material, there can also be employed elastic gel or elastic jelly.

Such material has to be so selected that it does not adhere, for example, by fusion to the front surface member or the solar cell element under the temperature and humidity at the actual use of the solar cell module.

It is also important to select a material that can be easily separated from the front surface member or the solar cell element at the disassembling of the solar cell module.

The solid layer, being elastic and adapted to eliminate the gap between the front surface member and the solar cell element, serves also as a countermeasure for moisture condensation and for pressure to be explained in the following.

Water Stopping Material

A water stopping material is provided so as to completely surround the periphery of the solar cell element and is supported between the front and back surface members, thereby preventing water intrusion from the end portions of the solar cell module.

The water stopping material is not particularly limited in material and shape thereof, but is preferably provided with weather resistance, mechanical strength and low permanent compression strain. It may be composed, for example, of silicone rubber or ethylene-propylene rubber.

Bushing

A bushing is used for improving the waterproof property in a portion where the lead wire is extracted from the solar cell module. The bushing is not particularly limited in material and shape thereof, but is preferably provided with weather resistance, mechanical strength and low permanent compression strain. It may be composed, for example, of silicone rubber or ethylene-propylene rubber. It is preferably of an annular shape and is fitted in a hole formed in advance, for example, in the back surface member, and the lead wire is guided through the hole of the bushing to ensure the waterproof property.

Even without such a bushing, a similar effect can be attained by simultaneously supporting the above-mentioned water stopping material and the lead wire with the front and back surface members.

Groove

A groove may be provided on the front surface member or the back surface member at the adjoining face between the front and back surface members, adjoining face between the front surface member and the lead wire, or adjoining face between the back surface member and the lead wire, thereby extending the path of water intrusion from the exterior of the solar cell module to the interior thereof and attaining the waterproof property. The structure of such a groove has to be designed so as to match the required waterproof property.

The structure of attaining the waterproof property with such a groove, not requiring additional components, can reduce the cost and is satisfactory in the disassembling, classifying and collecting properties.

Moisture Condensation Preventing Means

The condensation preventing means to be employed in the present invention is required to prevent deterioration in the electric performance and insulating performance of the solar cell module and in the physical properties of the components thereof, resulting from the moisture condensation in the solar cell module. Such means is preferably provided even in the solar cell module equipped with the above-mentioned water stopping means since the moisture condensation within the solar cell module may take place if an air layer is present therein.

In the following, there will be explained examples of the moisture condensation preventing means.

Photocatalyst

The moisture condensation in the solar cell module at first affects the waterproof property of the solar cell element and also results in clouding of a surface of the front surface member opposed to the solar cell element (hereinafter represented as the back side of the front surface member).

Such clouding increases the reflection of the solar light on the front surface member and reduces the light transmittance thereof, thus lowering the electric output of the solar cell module.

The waterproof property of the solar cell element has already been explained in the foregoing.

For avoiding the clouding on the back side of the front surface member, a surfacial layer consisting of photocatalyst particles only or containing photocatalyst is formed on the back side of the front surface member, and such a photocatalyst is excited by the solar light to render the back side of the front surface member superhydrophilic, whereby the moisture condensed on the back side forms a uniform water film to secure the light transmittance of the front surface member.

More specifically, the photocatalyst can be composed of $TiO_2$, $ZnO_2$, $SnO_2$, $SnTiO_3$, $WO_3$, $Bi_2O_3$, $Fe_2O_3$, CdTe, $MnS_2$, CaS or a mixture thereof.

Such hydrophilicity is maintained for a long time, and the hydrophilized surface absorbs the moisture in the air. Thus, such a photocatalyst may be employed in combination with the "hole+moisture permeating waterproof material" to be explained in the following, whereby the moisture in the solar cell module is collected during the night on the back side of the front surface member and is dissipated to the exterior of the solar cell module through the "hole+moisture permeating waterproof material" when the temperature in the solar cell module is elevated by the irradiation of the front surface member with the solar light in the morning.

Hole+Moisture Permeating Waterproof Material (Valve)

A hole connecting the exterior and the interior of the solar cell module is formed in the front surface member, back surface member or adjoining member of the solar cell module, and a material capable of permeating the moisture and having waterproof property is mounted in such a hole, whereby the moisture in the solar cell module is dissipated through the "hole+moisture permeating waterproof material" when the interior of the solar cell module is warmed up during the daytime.

Such a moisture permeating waterproof material is advantageously composed of a material having pores smaller than water molecules, such as Goatex (Goatex Inc.).

Also a desiccating material may be provided inside the solar cell module for achieving moisture absorption in the solar cell module and moisture dissipation to the exterior in a more efficient manner.

Vacuum

The gap between the front surface member and the back surface member may be evacuated to vacuum to eliminate the source of condensation, thereby preventing the moisture condensation on the light receiving surface of the solar cell element. More preferably, all the gaps within the solar cell module are maintained as a vacuum.

Dry Air

The air in the gap between the front surface member and the back surface member may be made dry at the preparation of the solar cell module to eliminate the water molecules constituting the source of condensation, thereby preventing the moisture condensation on the surface of the front surface member opposed to the solar cell element or the light receiving surface thereof. More preferably, all the gaps within the solar cell module are filled with dry air.

Spaceless Structure

A spaceless structure means such designing as to eliminate the space (air-containing space) in the solar cell module as far as possible. Such a structure allows for the elimination of water molecules constituting the source of condensation, thereby preventing the moisture condensation on the surface of the front surface member opposed to the solar cell element or the light receiving surface thereof.

On the other hand, such a spaceless structure lowers the heat insulating effect of the solar cell module, so that consideration must be taken of both factors.

Pressure Preventing Means 12

The pressure preventing means employed in the present invention is to prevent loss in the electrical performance and insulating performance of the solar cell module and in the physical properties of the components thereof, resulting from transmission of the external force to the solar cell element through the front surface member.

The pressure preventing means can be, for example:

a structure in which the strength of the front surface member is elevated to prevent transmission of the external force to the solar cell element through the front surface member;

a structure in which a material having light transmittance and elasticity such as the solid layer is provided between the front surface member and the solar cell element, whereby the external force is transmitted through the front surface member to the solid layer and is dispersed by the solid layer, thereby being transmitted to the solar cell element in such a dispersed state;

a structure in which a material having light transmittance and elasticity such as the solid layer is is provided between the front surface member and the solar cell element, thereby preventing abrasion by the interference between the front surface member and the solar cell element;

a method of forming the surface of the solar cell element in a flat structure, whereby the front surface member and the solar cell element are in planar contact to reduce the external force applied per unit area;

a structure of limiting in advance the contact portion of the front surface member and the solar cell element and forming such a contact portion as a power non-generating area by eliminating the surfacial transparent electrode of the solar cell element in such a contact portion;

a structure of supporting a power non-generating portion of the solar cell element with the front or back surface member, thereby separating the power generating portion of the light receiving surface of the solar cell module and the front surface member in a non-contact state; or a structure employing a flexible solar cell element, utilizing a flexible material such as a stainless steel plate for the substrate of the solar cell element.

Examples of the above-mentioned material with light transmittance and elasticity include silicon rubber, fluorinated rubber, acrylic rubber, urethane resin and ethylenic copolymer (EVA, etc.).

The ethylenic copolymer can be improved in light transmittance by crosslinking in advance. Such a material has to be so selected that it does not adhere, for example, by fusion to the front surface member or the solar cell element under the temperature and humidity of actual use of the solar cell module.

It is also important to select a material that can be easily separated from the front surface member or the solar cell element at the disassembling of the solar cell module.

Anti-Reflection Means

The anti-reflection means to be employed in the present invention is not particularly limited, but is preferably capable, as far as possible, of preventing the loss in the output of the solar cell module, resulting from light reflection by the front surface member. More specifically, there can be employed (1) a method of embossing the surface of the front surface member, thereby suppressing the surfacial reflection of the solar light, (2) a method of maintaining the front surface member and the solar cell element, or the front surface member, the solid layer and the solar cell element in close contact, thereby eliminating the air layer between such components and thus suppressing the reflection, or (3) a method of forming an anti-reflective layer on the front and back surfaces of the front surface member, those of the solid layer and the front surface of the solar cell element, thereby suppressing reflection.

Also the reflection can be suppressed by selecting the refractive indexes of the front and back surface members, solid layer and surfacial layer of the solar cell element in the following manner.

When two layers with different refractive indexes are adjacent, total reflection at the interface of the two layers can be prevented by making the refractive index smaller in the layer at the light entrance side.

Also when two layers with different refractive indexes are adjacent, reflection at the interface of the two layers can be suppressed by decreasing the difference between the respective refractive indexes.

More specifically, when the front surface member and solar cell element, or the front surface member, solid layer and solar cell element are in close contact as in Embodiment 1 or 3, for the refractive index n1 of the front surface member, n2 of the solid layer and n3 of the surfacial layer of the solar cell element, there are preferred the following conditions:
(A) n1, n2, n3 being equal to or larger than 1 (prevention of total reflection); and
(B) n1≦n2≦n3 (prevention of total reflection).

For example, if the surfacial layer (transparent conductive film) of the solar cell element is composed of a material with a refractive index of 2, the front surface member is preferably composed, for example, of glass (1.45 to 1.9), acrylic resin (1.49), polycarbonate resin (1.59), fluorinated resin (1.34 to 1.43) or silicone resin (1.43), while the solid layer is preferably composed, for example, of silicon rubber (1.4 to 1.5), fluorinated rubber (1.36), acrylic rubber (1.4 to 1.5), urethane resin (1.5 to 1.6) or EVA (1.5), wherein the numbers in the parentheses indicate the refractive indexes (same hereinafter unless specified otherwise).
(C) When n1, n2 and n3 can be arbitrarily selected, it is preferable to select n1 as close as possible to 1 and to minimize the differences among n1, n2 and n3 (suppression of reflection). Also when n3 is determined in advance, n1 and n2 are preferably so selected as to minimize the total reflectance determined by <reflectance between air and n1>, <reflectance between n1 and n2> and <reflectance between n2 and n3> (suppression of reflection).

For example, if the surfacial layer (transparent conductive film) of the solar cell element is composed of a material with a refractive index of 2, it is preferable, for suppressing the reflectance, to employ fluorinated resin (1.34) as the front surface member and urethane resin (1.6) as the solid layer (with the total reflectance of 4.1% to the vertically incident light), rather than employing glass (1.55) as the front surface member and urethane resin (1.6) as the solid layer (with the total reflectance of 5.9%).

When the front surface member and solar cell element are in close contact without the solid layer therebetween, there are preferred the following conditions:
(A) n1, n3 being equal to or larger than 1 (prevention of total reflection); and
(B) n1≦n3 (prevention of total reflection).
(C) When n1 and n3 can be arbitrarily selected, it is preferable to select n1 as close as possible to 1 and to minimize the difference between n1 and n3 (suppression of reflection). Also when n3 is determined in advance, n1 is preferably so selected as to minimize the total reflectance determined by <reflectance between air and n1> and <reflectance between n1 and n3> (suppression of reflection).

Also when a gas layer is present between the front surface member and solar cell element, if the refractive index n2 of the gas layer is controllable, for the refractive index n1 of the front surface member, n2 of the gas layer and n3 of the surfacial layer of the solar cell element, there are preferred the following conditions.
(A) n1, n2, n3 being equal to or larger than 1 (prevention of total reflection); and
(B) n1≦n2≦n3 (prevention of total reflection).
(C) When n1, n2 and n3 can be arbitrarily selected, it is preferable to select n1 as close as possible to 1 and to minimize the differences among n1, n2 and n3 (suppression of reflection). Also when n3 is determined in advance, n1 and n2 are preferably so selected as to minimize the total reflectance determined by <reflectance between air and n1>, <reflectance between n1 and n2> and <reflectance between n2 and n3> (suppression of reflection).

If the refractive index n2 of the gas layer is close to 1 (if the gas layer has a refractive index similar to that of air), there is preferred a condition:
(A) n1, n3 being as close as possible to 1 (suppression of reflection).

EXAMPLES

The present invention will be clarified further by examples thereof, but the present invention is by no means limited by such examples.

Example 1

The present example relates to Embodiment 1 and is characterized by a back surface member formed with a material with a uniform cross-section.

Figure 6A:
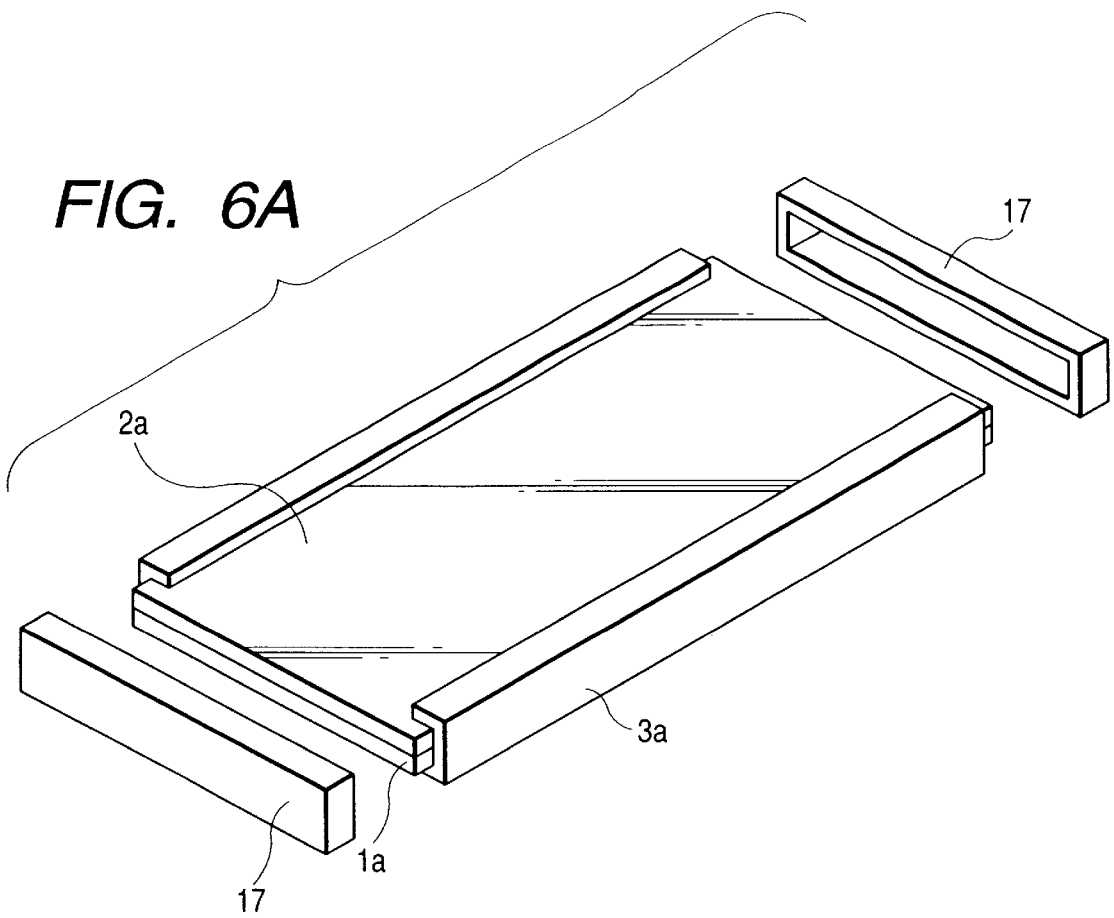
FIGS. 6A, 6B and 6C are schematic views of the solar cell module of Example 1.
Figure 6B:
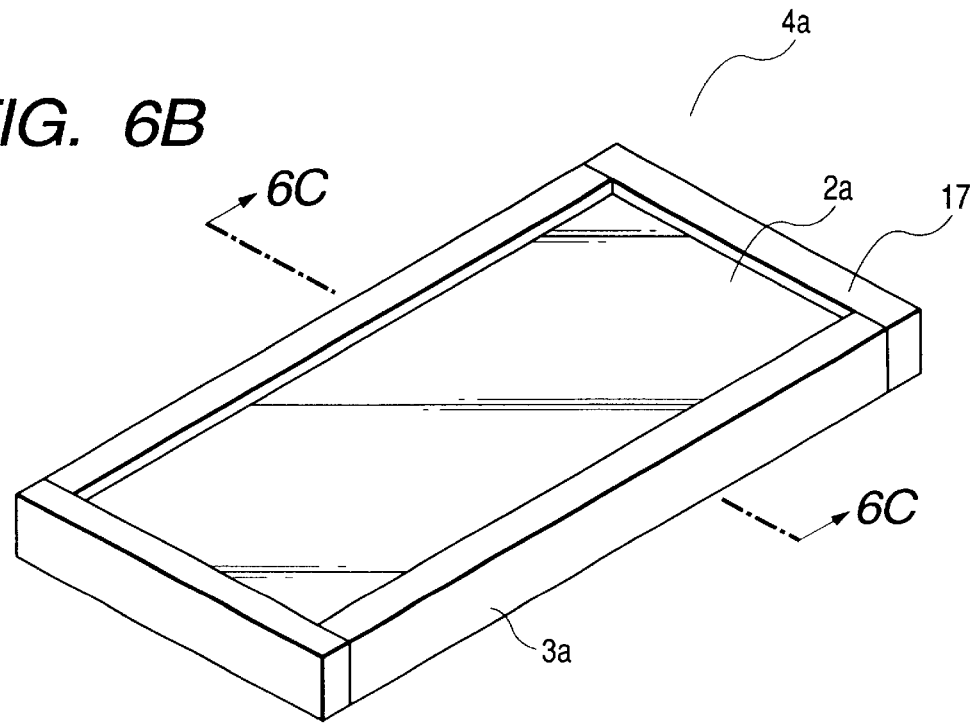
Figure 6C:
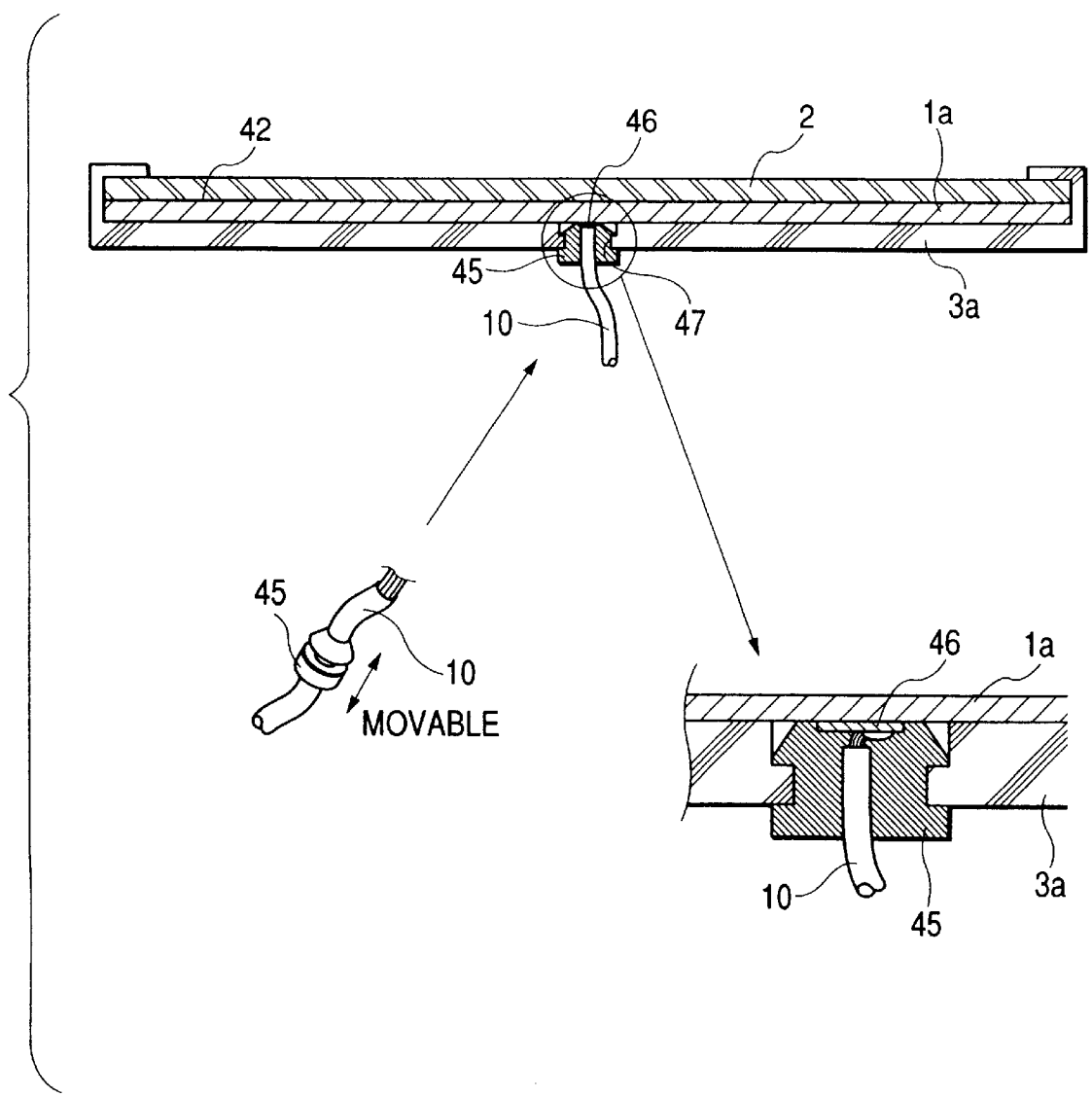

FIGS. 6A to 6C are schematic views showing the solar cell module of Example 1, wherein FIG. 6A is a schematic perspective view at the assembling seen from the side of the light receiving surface, FIG. 6B is a schematic perspective view seen from the side of the light receiving surface, and FIG. 6C is a cross-sectional view at the completed state, along a line 6C—6C 6C in FIG. 6B.

A solar cell element 1a (with a refractive index of 2 in the surfacial layer) was composed of a crystalline silicon solar cell element, which was connected in series to obtain the desired voltage.

A front surface member 2a, a back surface member 2b and a cap member 17 were composed of polycarbonate resin (refractive index 1.59).

A bushing 45 was composed of elastic silicone rubber.

The surface of the solar cell element 1a was not flat because of the presence of electrodes, etc. and was not adequate for direct contact with the front surface member 2a, so that a urethane resin sheet (refractive index 1.6) was employed as a solid layer 42 between the front surface member 2a and the solar cell element 1a.

At first the solid layer 42 and the front surface member 2a were superposed in succession on the solar cell element 1a, and these components were inserted into the back surface member 3a in such a manner that the front surface member 2a is directed to the side of the light receiving surface of the solar cell module. Then both ends in the longitudinal direction were sealed with the cap members 17.

Finally, for forming the output terminal, a lead wire inserted in advance into the bushing 45 was soldered to a take-out electrode 46 of the solar cell element 1a, and the bushing was shifted and fixed to a hole 47 formed in advance in the back surface member 3a, whereby the solar cell module 4a was completed.

In the above-described solar cell module, since the back surface member has a uniform cross-section and can be molded with an extrusion mold, the molding cost is low and there can be obtained the solar cell module of an arbitrary length.

Also as the front and back surface members, the cap member and the bushing are composed of the same transparent material, the material cost can be reduced and the recycling property after classification can be improved.

Also the bushing, merely inserted into the back surface member, can be easily classified.

Example 2

The present example relates to Embodiment 1 and is characterized by a back surface member formed with a flat plate formed into the shape of a bath tub.

Figure 7A:
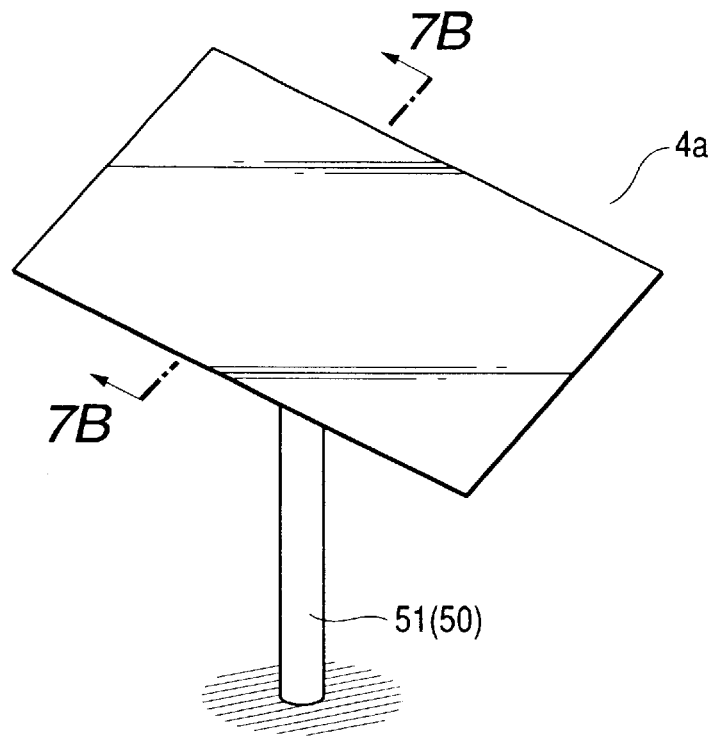
FIGS. 7A and 7B are schematic views of the solar cell module of Example 2.
Figure 7B:
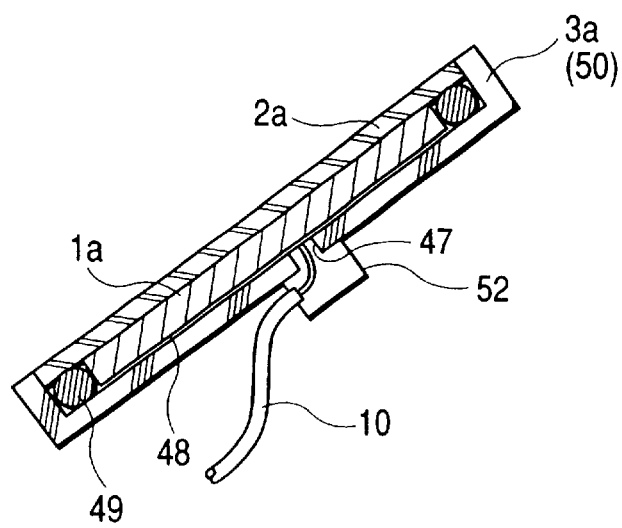

FIGS. 7A and 7B are schematic views showing the solar cell module of Example 2 to be installed on an outdoor support, wherein FIG. 7A is a schematic perspective view seen from the side of the light receiving surface, and FIG. 7B is a cross-sectional view along a line 7B—7B in FIG. 7A.

A solar cell element 1a (having a surfacial layer (glass substrate) of a refractive index of 1.6) was of a monolithic structure, obtained by forming amorphous semiconductor on a glass substrate (light non-receiving side) and dividing the cell into serially connected small sections, for example, by laser scribing, thereby reducing the output current from a single cell and elevating the output voltage of the entire module. An insulating film 48 was composed of an elastic silicone rubber sheet of a certain thickness.

A front surface member 2a was composed of a flat reinforced white glass plate (refractive index 1.5), and a back surface member 3a was formed by folding the four sides of a stainless steel plate into a bath tub shape and was provided in advance with a hole 47 for the output terminal. A gasket 49 was composed of silicone rubber with low permanent compression strain. The back surface member 3a constitutes a part of a support 50, which was composed of the back surface member 3a and a pillar 51.

At first the insulating film was placed on the back surface member 3a placed in advance, and the solar cell element 1a was placed thereon. Then the gasket 49 was provided so as to rectangularly surround the solar cell element 1a, and the front surface member was superposed. As a result, the solar cell element 2a was sandwiched between the front surface member 2a and the back surface member 3a, and the gasket 49 was supported by pinching the front surface member 2a and the back surface member 3a to prevent water intrusion into the interior of the solar cell module.

Finally, a lead wire 10 was soldered to the solar cell element 1a through the hole 47 provided in the back surface member 3a, and the hole portion was covered with a terminal box 52 to complete the solar cell module 4a. In this operation, the terminal box 52 was fixed, so as to be removable afterwards, with a two-sided adhesive tape, consisting of an acrylic substrate and an acrylic adhesive agent so as to have a practically sufficient adhesive force and to be removable afterwards.

In the above-described solar cell module, since the back surface member is formed by bending a flat plate into the shape of a bath tub, there can be employed a general-purpose roller molding machine or a general-purpose folding machine with a low molding cost, and there can be obtained variously shaped solar cell modules.

Also after the collection, the original flat shape can be restored by flattening the folded portions or pressing the member flat, whereby the recycling property can be improved.

Also the front surface member 2a is adjoined, by the weight thereof, with the back surface member, so that a particular fitting structure is not required for the front and back surface members, and excellent molding cost, assembling cost and maintenance property can be achieved. Also, as the elastic insulating film is provided between the solar cell element and the back surface member, the solar cell element is always in contact with the front surface member by the elasticity of the insulating film, whereby the gap between the front surface member and the solar cell element can be easily removed.

Also the solar cell module can be used for a prolonged period by employing a highly durable material for the support member and can be used in continuation by the replacement of the front surface member or the solar cell element only.

Also as the solar cell element is of a monolithic structure with a flat surface, the front surface member and the solar cell element can be merely superposed to eliminate the gap therebetween, whereby the member for eliminating the gap is unnecessary to reduce the cost and to improve the recycling property.

Furthermore, the terminal box, being merely fixed with the two-sided adhesive tape, can be easily removed, and the lead wire, merely soldered to the solar cell element, can be easily classified.

Example 3

The present example relates to Embodiment 2 and is characterized by a front surface member formed with a flat plate and the front and back surface members adjoined by ultrasonic fusion.

Figure 8A:
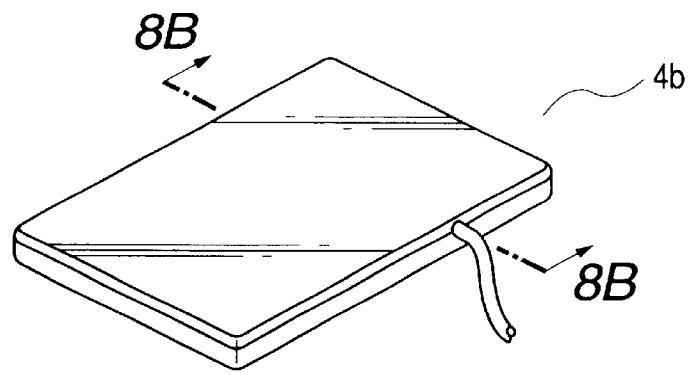
FIGS. 8A and 8B are schematic views of the solar cell module of Example 3.
Figure 8B:
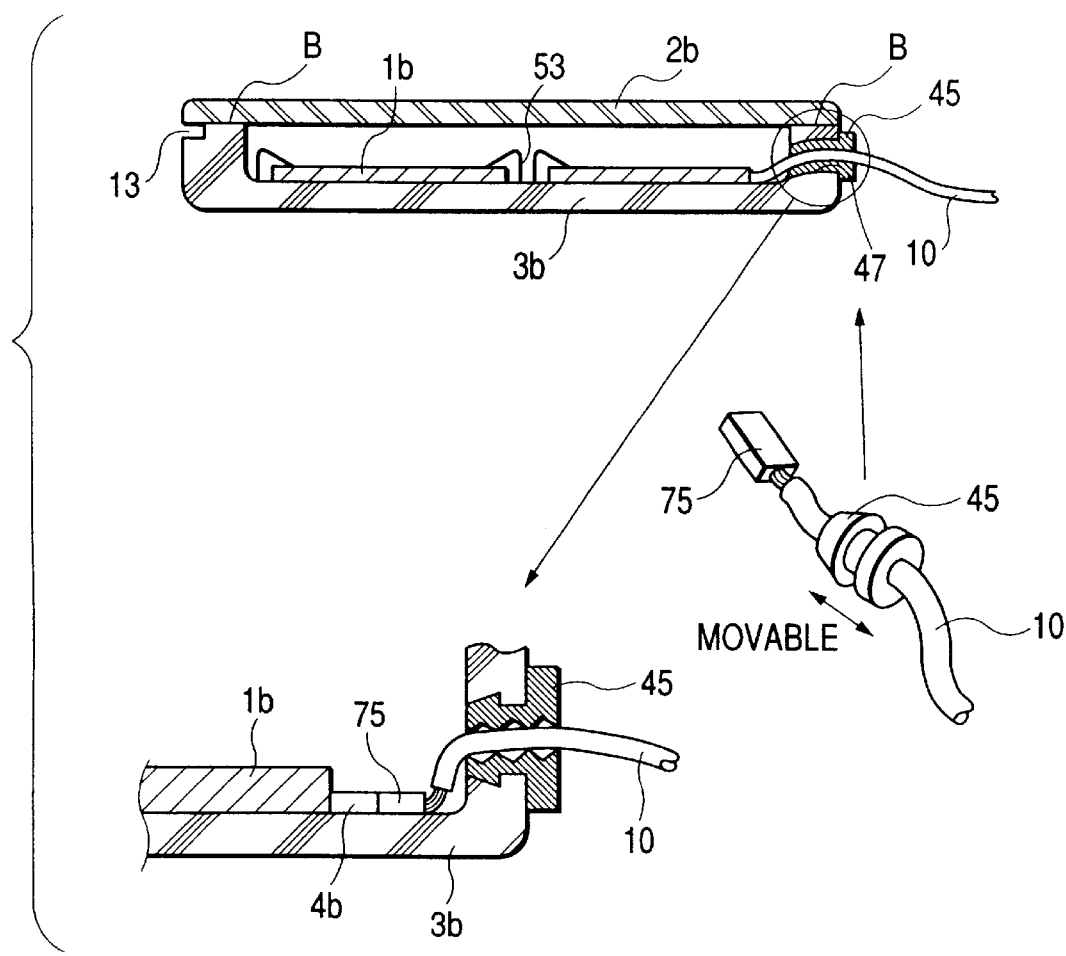

FIGS. 8A and 8B are schematic views showing the solar cell module of Example 3, wherein FIG. 8A is a schematic perspective view seen from the side of the light receiving surface, and FIG. 8B is a cross-sectional view along a line 8B—8B in FIG. 8A.

A solar cell element 1b was composed of an amorphous silicon solar element with a stainless steel substrate.

A front surface member 2b and a back surface member 3b were composed of polycarbonate resin.

The front surface member 2b was given in advance, on the surface opposed to the solar cell element, a surfacial layer containing photocatalyst.

Also the back surface member 3b was provided in advance with a solar cell element engaging piece 53 for fixing the solar cell element 1b and a hole 47 for introducing a lead wire 10.

A bushing 45 was composed of silicone rubber.

At first plural solar cell elements 1b were fixed to the solar cell element engaging pieces 53 provided on the back surface member 3b, and the elements 1b were serially connected to obtain the desired voltage.

Then, forming the output terminal, a copper tab 75 connected at an end of the lead wire 10 inserted in advance into the bushing 45 was laser welded to the take-out electrode 46 of the solar cell element 1b, and the bushing 45 was shifted and fixed to the hole 47.

Finally the front surface member 2b was superposed, and an illustrated portion B was fixed by ultrasonic fusion to complete the solar cell module 4b.

In the above-described solar cell module, as the front and back surface members are fixed by ultrasonic fusion, there is obtained excellent water tightness and the front and back surface members can be classified by inserting a screw driver or the like into a releasing groove 13. As screws or the like are not used, there can be improved the assembling property and the classification/collection property.

At the classification, residues of the back surface member or the front surface member may remain respectively on the front or back surface member, but the recycling property is not affected since the front and back surface members are composed of the same material.

On a thus classified back surface member, the solar cell element is fixed merely by the engaging pieces and can therefore be easily removed.

Also since the front surface member is composed of a flat plate, there can be employed a general-purpose flat plate material and the manufacturing cost can be significantly lowered.

Also the copper tab of the lead wire and the take-out electrode of the solar cell element are laser welded at the ends thereof, and such welded part can be easily cut off to classify the solar cell element and the lead wire.

Example 4

The present example relates to Embodiment 2 mand is characterized by the solar cell module being prepared after the solar cell elements are formed into a unit.

Figure 9A:
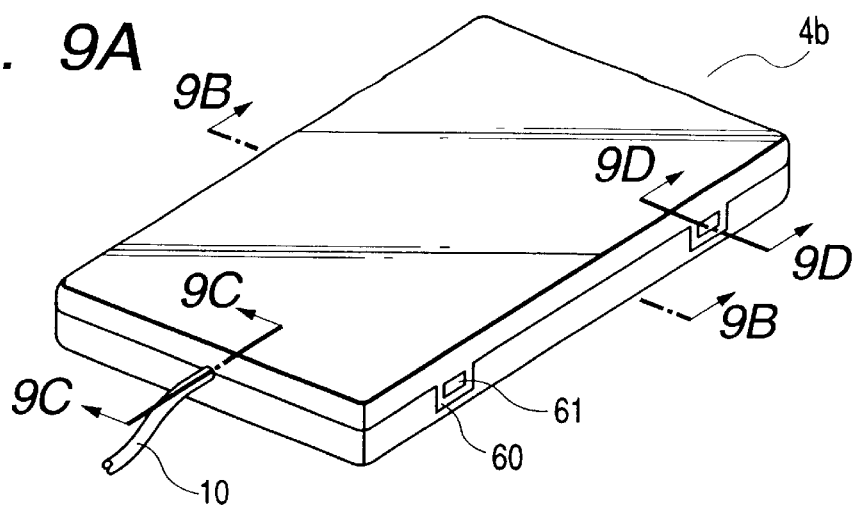
FIGS. 9A, 9B, 9C, 9D, 9E and 9F are schematic views of the solar cell module of Example 4.
Figure 9B:
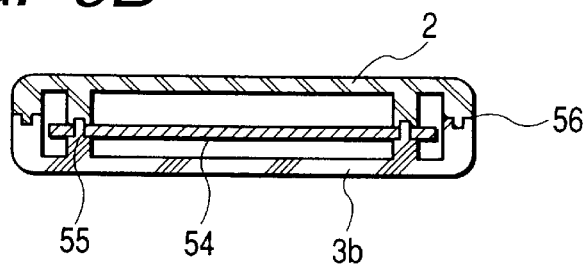
Figure 9D:
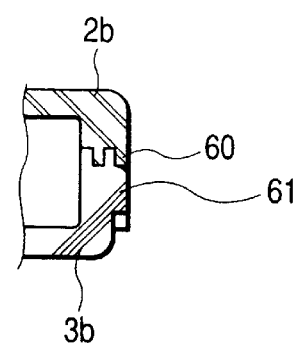
Figure 9C:
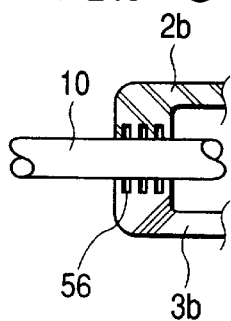
Figure 9E:
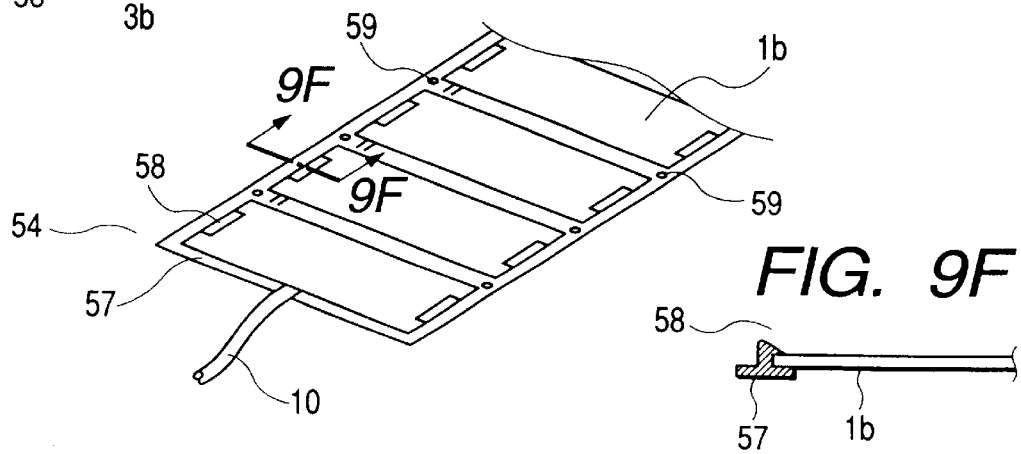
Figure 9F:
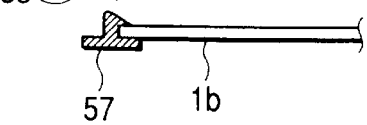

FIGS. 9A to 9F are schematic views showing the solar cell module of Example 4, wherein FIG. 9A is a schematic perspective view seen from the side of the light receiving surface, FIG. 9B is a cross-sectional view along a line 9B—9B in FIG. 9A, FIG. 9C is a cross-sectional view along a line 9C—9C in FIG. 9A, FIG. 9D is a cross-sectional view along a line 9D—9D in FIG. 9A, FIG. 9E is a schematic perspective view of a solar cell element unit shown in FIG. 9B, and FIG. 9F is a cross-sectional view along a line 9F—9F in FIG. 9E.

A solar cell element 1b was composed of an amorphous silicon solar cell element utilizing a stainless steel substrate.

A front surface member 2b and a back surface member 3b were composed of polycarbonate resin.

The front surface member 2b was provided in advance with a surfacial layer containing photocatalyst on the surface opposed to the solar cell element.

Also the back surface member 3b was provided in advance with a base 55 for holding a solar cell element unit 54.

On both the front surface member 2b and the back surface member 3b, there were provided water stopping grooves 56 on the adjoining faces, and a water stopping groove 56 was provided also in the take-out portion of a lead wire 10.

At first plural solar cell elements 1b were fixed on a supporting plate 57 to form a solar cell element unit 54. The supporting plate 57 was provided with engaging pieces 58, thereby easily fixing the solar cell elements 1b in a removable manner. The supporting plate 57 was composed of polycarbonate resin, same as that employed for the front surface member 2b and the back surface member 3b.

Then, on the supporting plate 57, the solar cell elements 1b were serially connected to obtain the desired voltage.

Then, the lead wire 10 was connected to the solar cell element 1b as in Example 3, and a fixing hole 59 provided in the solar cell element unit 54 was inserted into the base 55 provided on the back surface member, thereby fixing the solar cell element unit 54 to the back surface member 3b. Then the lead wire 10 was guided to the exterior of the solar cell module 4b and the front surface member 2b was mounted to complete the solar cell module 4b.

The front surface member 2b and the back surface member 3b were mechanically fixed by engaging flexible engaging pieces 60, provided on the front surface member 2b, with protruding portions 61 provided on the back surface member 3b.

The above-described solar cell module can be easily classified and collected, as the solar cell element is merely inserted, through the solar cell unit, into the base provided on the back surface member.

Also since the individual solar cell elements are collectively integrated as a solar cell unit, they can be collectively removed from the back surface member to achieve superior assembling property and classification/collection property in comparison with Example 2.

Also as the solar cell element is supported in a state spaced from the front surface member, there can be avoided the influence of transmission of the external force to the solar cell element or the influence of friction caused by the interference between the front surface member and the solar cell element.

Example 5

The present example relates to Embodiment 3 and is principally characterized by the back surface member and the adjoining member being integrally formed through a hinge and the lead wire being formed into a unit for easy attachment and detachment.

Figure 10A:
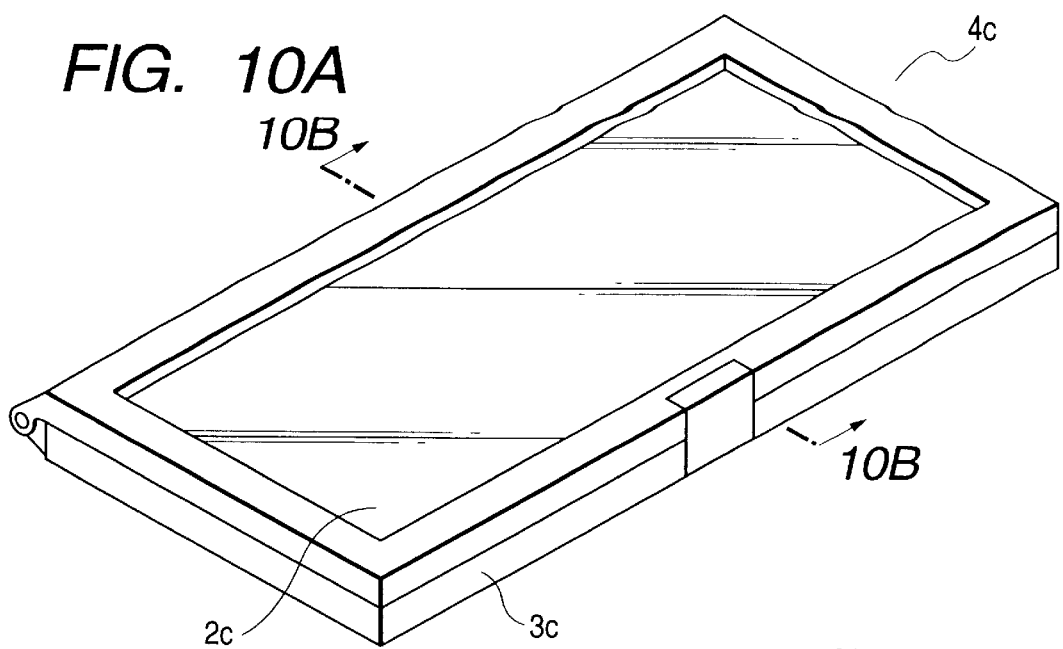
FIGS. 10A, 10B and 10C are schematic views of the solar cell module of Example 5.
Figure 10B:
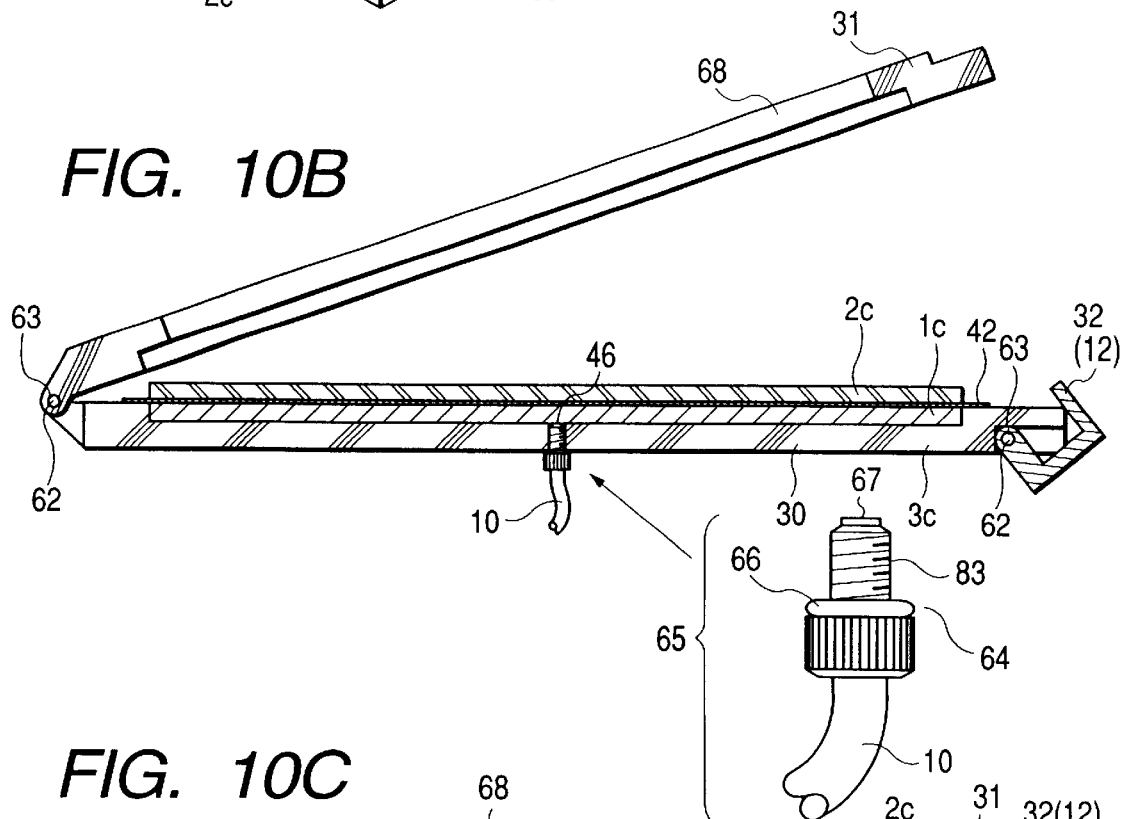
Figure 10C:
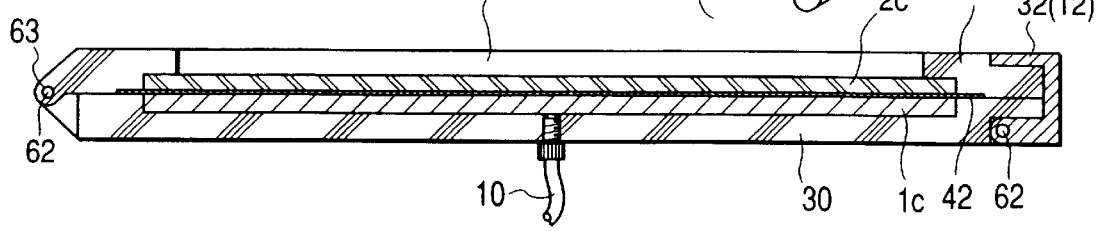

FIGS. 10A to 10C are schematic views showing the solar cell module of Example 5, wherein FIG. 10A is a schematic perspective view seen from the side of the light receiving surface, FIG. 10B is a schematic cross-sectional view along a line 10B—10B in FIG. 10A at the assembling, and FIG. 10C is a schematic cross-sectional view at the completed state, along the line 10B—10B in FIG. 10A.

A solar cell element 1c (with a refractive index of 2 in the surfacial layer) was composed of a crystalline silicon solar cell element, which was connected in series to obtain the desired voltage.

A front surface member 2c was composed of a reinforced white glass plate, while a back surface member 3c and an adjoining member 12 were composed of acrylic resin (refractive index 1.49).

The back surface member 3c was composed of a base portion 30 and a cover portion 31 having an aperture 68, and a pin portion 62 provided in the base portion 30 was fitted with a notched hole 63 provided in the cover portion 31 to constitute a hinge for connecting the portions.

Also in a locking portion 32 constituting the adjoining member 12, a notched hole 63 provided thereon was fitted with the pin portion 62 provided on the base portion 30 to constitute a hinge for mutual connection.

The surface of the solar cell element 1c was not flat because of the presence of electrodes, etc. and was not adequate for direct contact with the front surface member 2c, so that an acrylic rubber sheet (refractive index 1.5) was employed as a solid layer 42 between the front surface member 2c and the solar cell element 1c.

At first the solar cell element 1c was placed on the base portion 30 of the back surface member 3c, then the solid layer 42 of the size of the solar cell element 1c was placed thereon, and the front surface member 2c was placed thereon. Finally the base portion 30 and the cover portion 31 were superposed and were mechanically fixed by the lock portion 32.

The solar cell element 1c, solid layer 42 and front surface member 2c were supported by pinching between the base portion 30 and the cover portion 31, and the external frame portion of the solid layer 42 was singly supported by pinching the base portion 30 and the cover portion 31.

Finally, a joint 64 mounted on the end of the lead wire 10 was fixed by screwing on the rear surface member 3c to electrically connect the solar cell element 1c and the lead wire 10, thereby completing the solar cell module 4c.

At the end of the lead wire 10, a resin joint 64 was integrally melded to form a lead wire unit 65, and the joint 64 was provided with a male screw 83. The joint 64 was also equipped with an O-ring 66 of silicone rubber for attaining water tightness between the joint 64 and the solar cell module 4c. The lead wire 10 is electrically connected with a contact 67 provided at the end of the joint 64, and the contact 67 and the take-out electrode 46 of the solar cell element 1c are electrically connected by screwing the joint 64 into the back side of the solar cell module 4c.

In the above-described solar cell module, the base portion, cover portion, lock portion and hinge portion are composed of the same material and can therefore be recycled without disassembling after collection.

Also the external frame portion of the solid layer is pinched between the base portion and the cover portion, so that the solar cell module can be made watertight without employing an additional gasket or the like, and the classification/collection property can be improved due to the absence of such an additional member.

Also the electrical connection between the solar cell element and the lead wire can be achieved, in contrast to the soldering in Examples 1 to 4, by screwing of the lead wire unit into the solar cell module, whereby attained are excellent assembling property, replaceability of the lead wire and classification/collection property.

Example 6

The present example relates to Embodiment 3 and is principally characterized by an adjoining member not requiring disassembling or separation after collection.

Figure 11A:
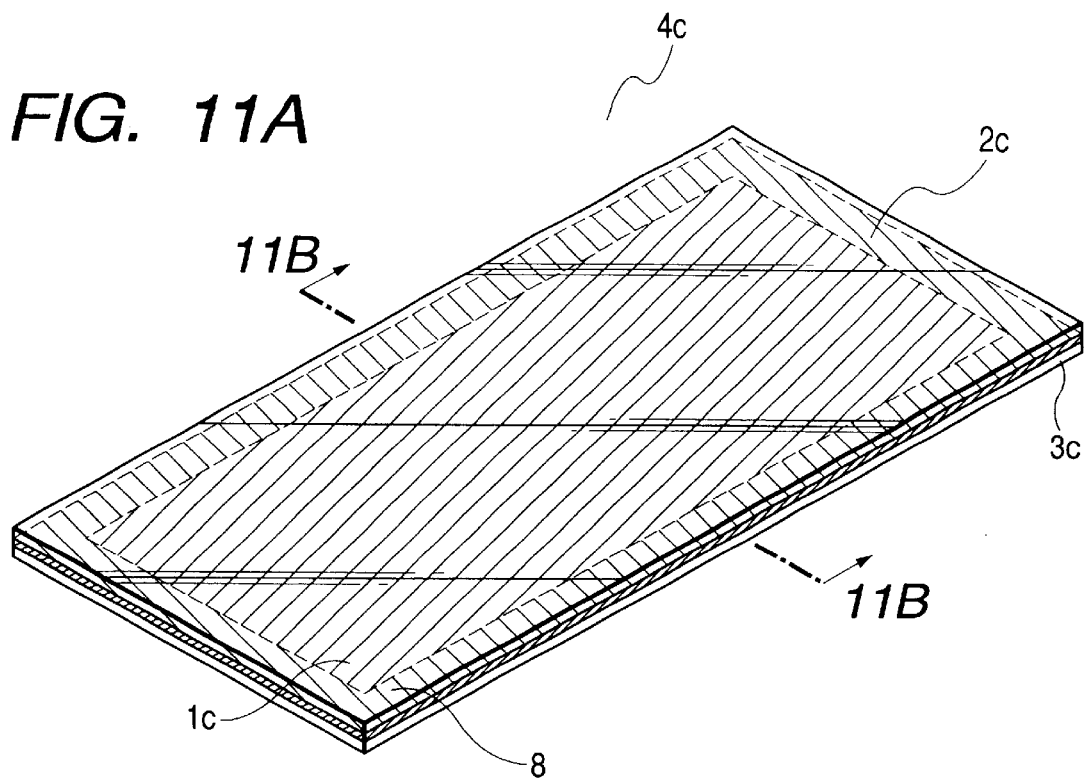
FIGS. 11A and 11B are schematic views of the solar cell module of Example 6.
Figure 11B:
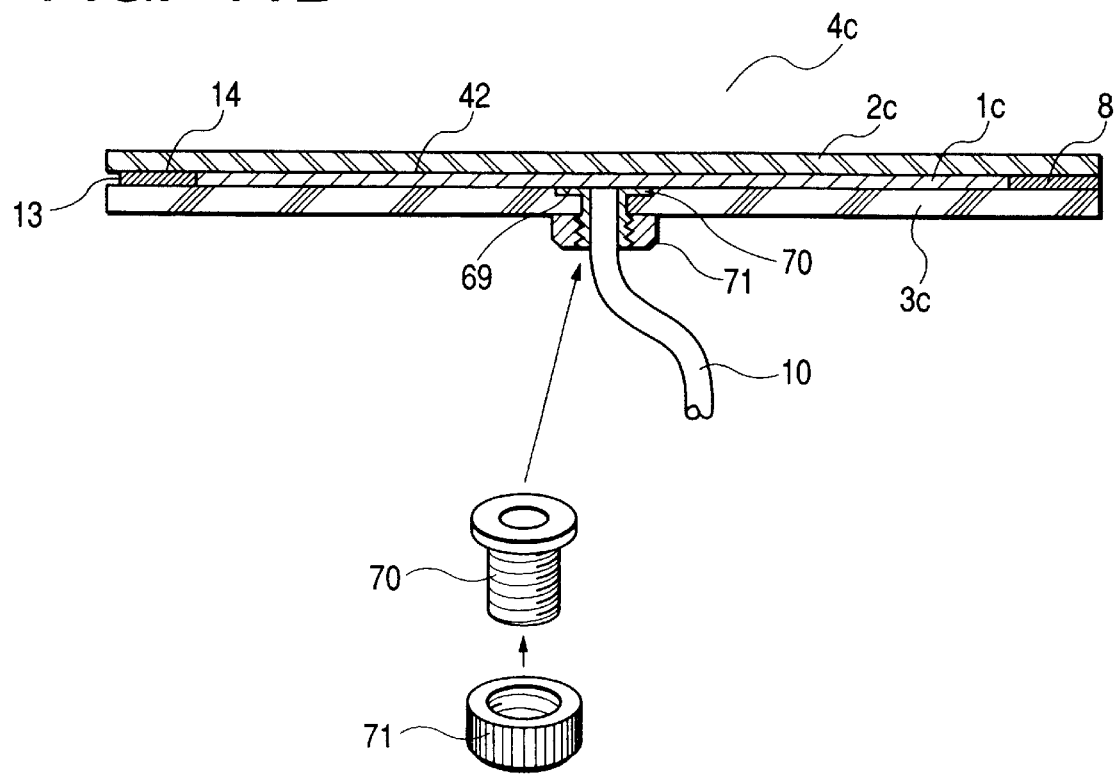

FIGS. 11A and 11B are schematic views showing the solar cell module of Example 6, wherein FIG. 11A is a schematic perspective view seen from the side of the light receiving surface, and FIG. 11B is a schematic cross-sectional view along a line 11B—11B in FIG. 11A.

A solar cell element 1c (with a refractive index of 2 in the surfacial layer) was composed of a crystalline silicon solar cell element, which was connected in series to obtain the desired voltage.

A front surface member 2c was composed of a reinforced white glass plate (refractive index 1.45), while a back surface member 3c was composed of ABS resin.

The front surface member 2c was provided with a black coating 14 only in the area of a two-sided adhesive tape 8, in order to prevent solar light irradiation thereon.

The two-sided adhesive tape 8 was composed of a polystyrene substrate, coated on both sides thereof with an adhesive material mutually soluble with ABS resin (PS/ABS mutually soluble two-sided tape, manufactured by Sumitomo 3M Co.). The adhesive material was so selected as to satisfy a condition that "adhesive force between the back surface member 3c and the two-sided tape 8">"adhesive force between the front surface member 2c and the two-sided tape 8".

The surface of the solar cell element 1c was not flat because of the presence of electrodes, etc. and was not adequate for direct contact with the front surface member 2c, so that a silicone rubber sheet (refractive index 1.5) was employed as a solid layer 42 between the front surface member 2c and the solar cell element 1c.

At first, a flanged sleeve 70 was mounted on a stepped hole 69 provided in the back surface member 3c for taking out the lead wire 10. The flanged sleeve 70 was composed of ABS resin and was provided with a male screw.

Then the two-sided adhesive tape 8 was adhered in a rectangular form on the back surface member 3c, and the solar cell element 1c and the solid layer were provided inside the two-sided tape 8. Then the front surface member 2c was superposed and adhered to the two-sided tape.

Then the lead wire 10 was inserted into a stopper 71 composed of ABS resin and provided internally with a tapered female screw and was soldered to the solar cell element 1c.

Finally the flanged sleeve 70 was screwed with the stopper 71 to mechanically fix the lead wire 10 to the solar cell module 4c and to ensure water tightness at the connecting portion, thereby completing the solar cell module 4c.

The above-described solar cell module can be easily classified into the front surface member, solid layer, solar cell element and back surface member by inserting a screw driver or the like into a releasing groove 13.

At the classification, the two-sided tape, composed of materials mutually soluble with the material of the back surface member, remains thereon so that the back surface member can be re-used without peeling off the two-sided tape.

Example 7

The present example relates to Embodiment 3 and is principally characterized by the use of an ordinary roofing material as the back surface member.

Figure 12A:
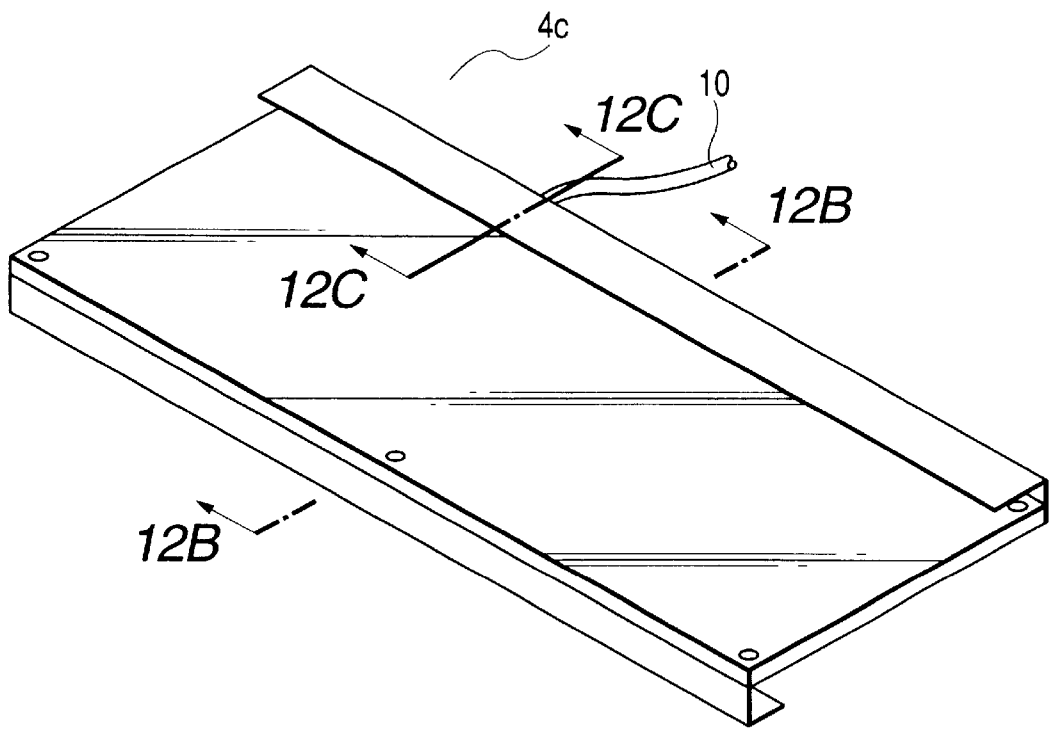
FIGS. 12A, 12B, 12C, 13A, 13B and 13C are schematic views of the solar cell modules of Example 7.
Figure 12B:
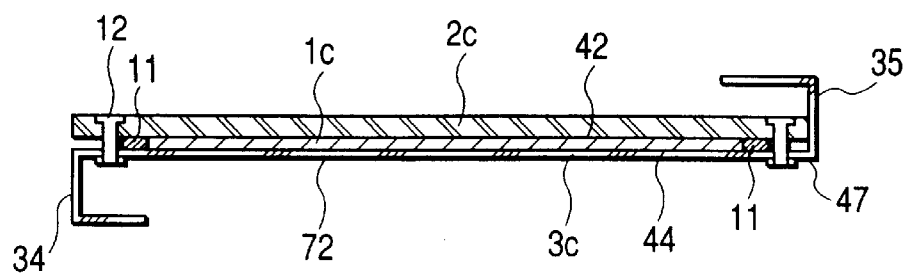
Figure 12C:
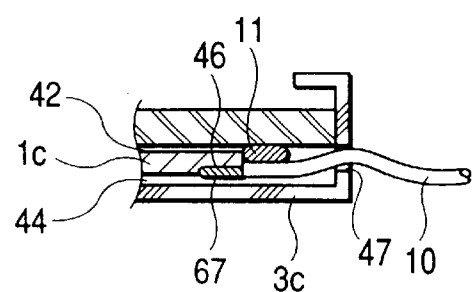

FIGS. 12A to L2C are schematic views showing the solar cell module of Example 7, wherein FIG. 12A is a schematic perspective view seen from the side of the light receiving surface, FIG. 12B is a schematic cross-sectional view along a line 12B—12B in FIG. 12A, and FIG. 12C is a schematic cross-sectional view along a line 12C—12C in FIG. 12A.

A solar cell element 1c (with a refractive index of 2 in the surfacial layer) was composed of a crystalline silicon solar cell element, which was connected in series to obtain the desired voltage.

A front surface member 2c was composed of a reinforced white glass plate (refractive index 1.5), while a back surface member 3c was composed of a stainless steel plate.

The back surface member 3c was provided with holes 47 for inserting an adjoining member 12 and for taking out a lead wire 10 and was then folded into a shape shown in FIG. 12B. More specifically, at an engaging portion 34 at the eaves side, the back surface member 3c was folded downwards from a flat portion 72 and further folded back toward the roof ridge side. Also at an engaging portion 35 at the roof ridge side, the member was folded vertically upwards and further folded back toward the eaves side. The folding work was executed with a roller forming machine as employed for ordinary roofing materials.

The adjoining member 12 was composed of a bolt and a nut for achieving easy adjoining and releasing.

As a solid layer 42 between the front surface member 2c and the solar cell element 1c, there was employed a urethane resin sheet (refractive index 1.6).

Since the back surface member 3c was electrically conductive, insulation was required between the solar cell element 1c and the back surface member 3c, and a PET resin sheet was employed as the insulating sheet 44 therebetween.

At first, on the back surface member 3c there was placed the insulating sheet 44, and a part of the lead wire provided in advance with a contact 67 was placed thereon. Then the solar cell element 1c provided in advance with the take-out electrode 46 was placed, then the solid layer 42 was placed thereon and a water stopping member 11 consisting of EPDM rubber was placed so as to completely surround the periphery of the solar cell element 1c.

The other end of the lead wire 10 was guided to the exterior of the solar cell module 4c through the hole 47 provided in the back surface member 3c.

Finally, the front surface member 2c was superposed, and the front surface member 2c and the back surface member 3c were mechanically fixed with the adjoining members 12 to sandwich the insulating sheet 44, lead wire 10, solar cell element 1c, solid layer 42 and water stopping member 11, thereby completing the solar cell module 4c integrated with the roofing material of the lateral roofing type. The lead wire 10, pinched between the water stopping member 11 and the back surface member 3c, is guided to the exterior, thereby preventing water intrusion from the take-out portion.

The electrical connection is attained by contact of the take-out electrode 46 of the solar cell element 1c and the contact 67.

The above-described solar cell module can reduce the manufacturing cost, since the back surface member can be prepared with a forming machine the same as that for ordinary roofing material. Also the completed solar cell module integrated with the roofing material has engaging portions similar to those of the conventional roofing material and can therefore be worked in the same manner as or used in combination with conventional roofing material.

Also as the electrical connection is achieved by contact of the solar cell element and the lead wire, there can be achieved excellent assembling property and classification/collection property.

Also there can be obtained the solar cell module integral with the roofing material, same in shape as conventional roofing material by modifying the shape of the back surface member in a similar process.

Figure 13A:
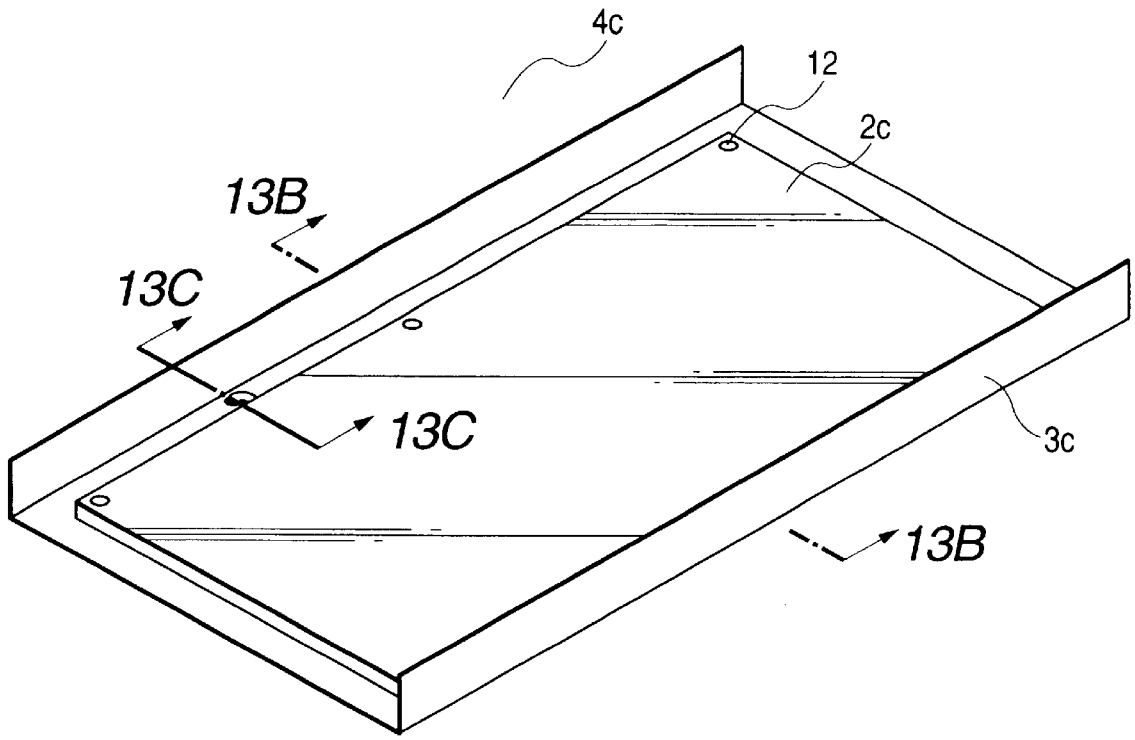
Figure 13B:
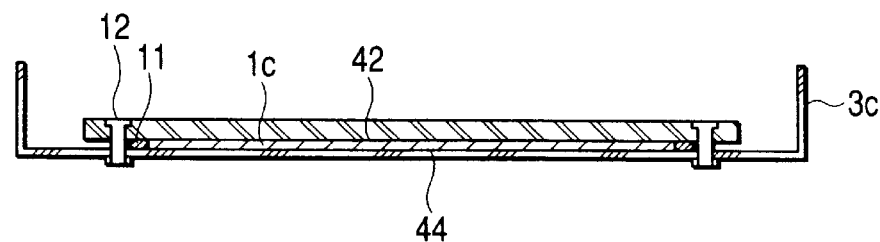
Figure 13C:
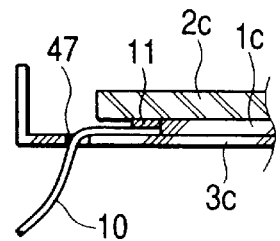

FIGS. 13A to 13C are schematic views showing a solar cell module integral with the roofing tile for the slate-rod roofing, wherein FIG. 13A is a schematic perspective view seen from the side of the light receiving surface, FIG. 13B is a schematic cross-sectional view along a line 13B—13B in FIG. 13A, and FIG. 13C is a schematic cross-sectional view along a line 13C—13C in FIG. 13A.

Example 8

The present example relates to Embodiment 3 and is principally characterized by the use of an ordinary roofing material as the back surface member. In contrast to Example 7 in which the ordinary roofing material was employed with a partial working, this example employed the ordinary roofing material without any working.

Figure 14A:
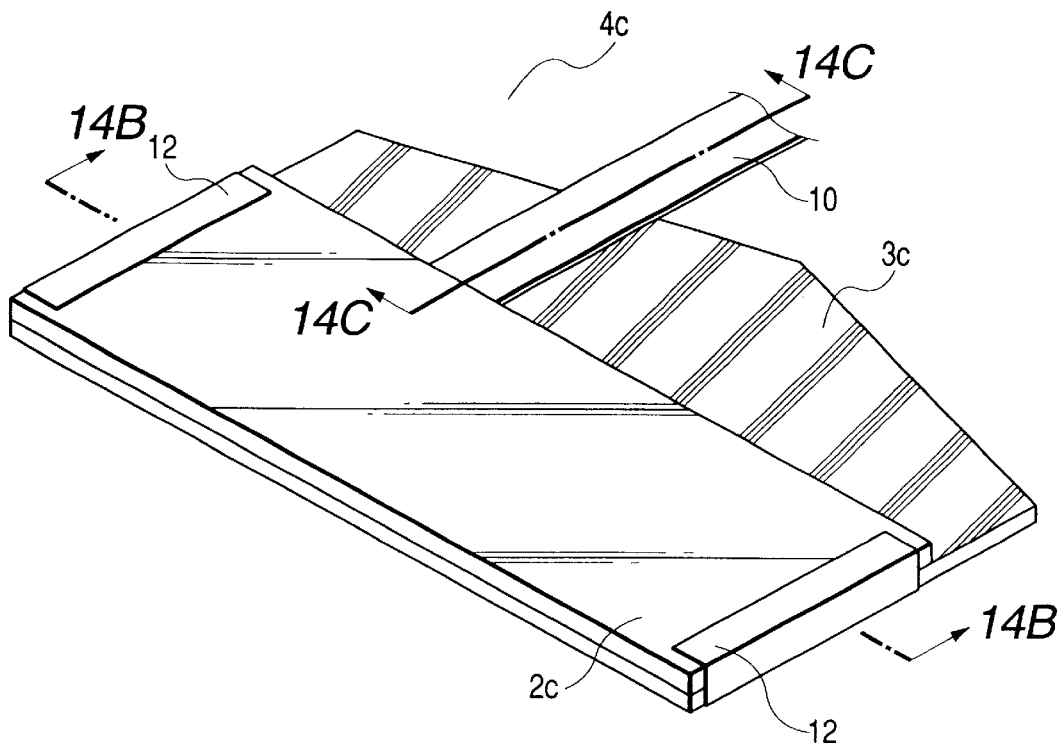
FIGS. 14A, 14B and 14C are schematic views of the solar cell module of Example 8.
Figure 14B:
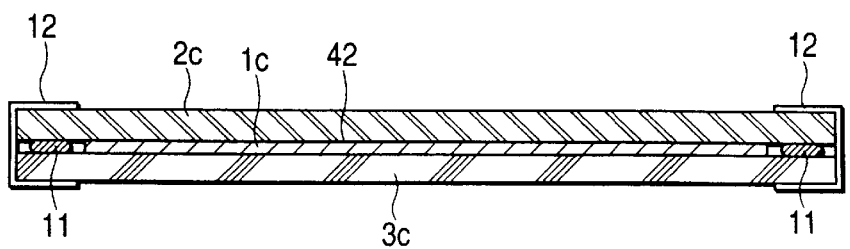
Figure 14C:
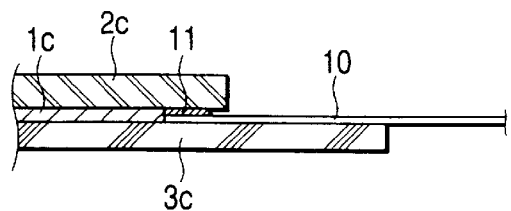

FIGS. 14A to 14C are schematic views showing the solar cell module of Example 8, wherein FIG. 14A is a schematic perspective view seen from the side of the light receiving surface, FIG. 14B is a schematic cross-sectional view along a line 14B—14B in FIG. 14A, and FIG. 14C is a schematic cross-sectional view along a line 14C—14C in FIG. 14A.

A solar cell element 1c (with a refractive index of 2 in the surfacial layer) was composed of a crystalline silicon solar cell element, which was connected in series to obtain the desired voltage.

A front surface member 2c was composed of a fluorinated resin plate (refractive index 1.34), while a back surface member 3c was composed of a commercially available roofing slate.

An adjoining member 12 was composed of a cap formed by folding a stainless steel plate into a square U shape.

As a solid layer 42 between the front surface member 2c and the solar cell element 1c, there was employed a fluorinated rubber sheet (refractive index 1.36).

At first, on the back surface member 3c there was placed the solar cell element 1c to which the lead wire 10 (flat cable) was soldered in advance, then the solid layer 42 was placed thereon and a water stopping member 11 consisting of EPDM rubber was placed so as to completely surround the periphery of the solar cell element 1c. Then the front surface member 2c was superposed, and finally the ends of the front surface member 2c and the back surface member 3c were mechanically fixed with the adjoining members 12 to sandwich the solar cell element 1c, solid layer 42 and water stopping member 11, thereby completing the solar cell module 4c integrated with the roofing material of the roofing tile form.

The lead wire 10, pinched between the water stopping member 11 and the back surface member 3c, was guided to the exterior, thereby preventing water intrusion from the take-out portion.

The above-described solar cell module can reduce the manufacturing cost, since the commercially available roofing slate can be used. Also the completed solar cell module integrated with the roofing material can be worked in the same manner as or used in combination with conventional roofing material.

Also when employing a material the strength of which has been deteriorated by forming a penetrating hole, such as roofing slate, as the back surface member, the solar cell module of the present example can be prepared without loss of the strength of the roofing material by utilizing the cap-shaped adjoining member.

Example 9

The present example relates to Embodiment 3 and is principally characterized by the use of an ordinary roofing material as the back surface member.

Figure 15A:
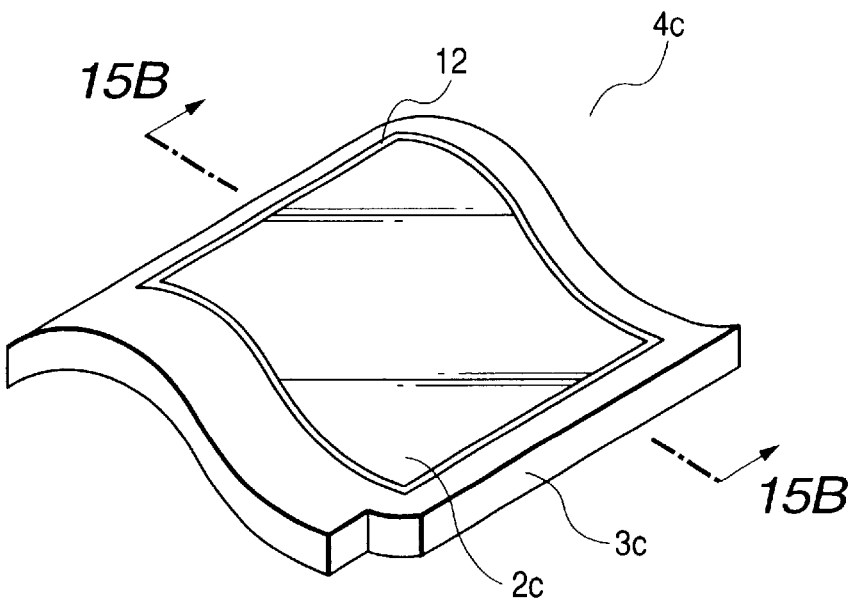
FIGS. 15A and 15B are schematic views of the solar cell module of Example 9.
Figure 15B:
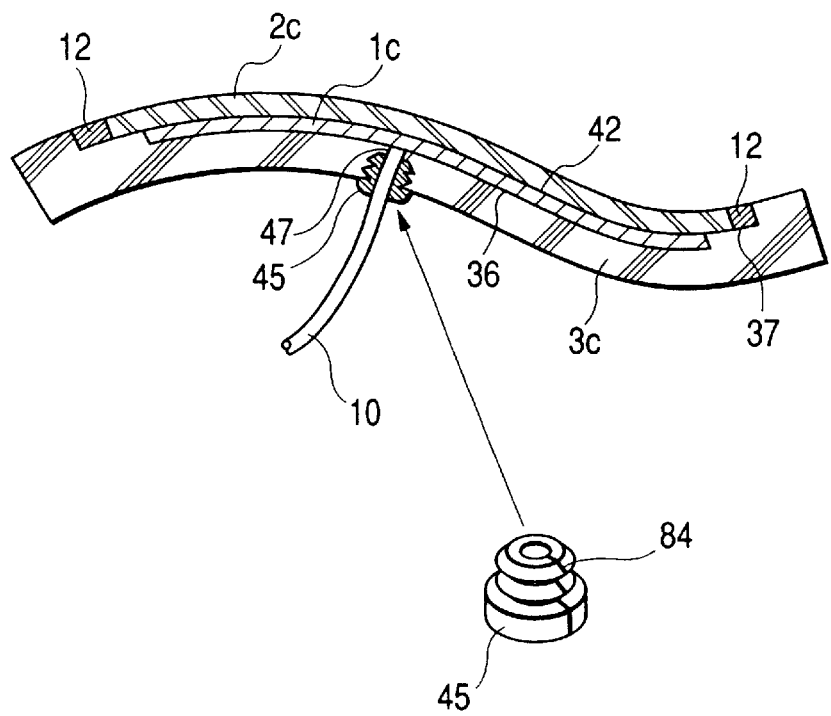

FIGS. 15A and 15B are schematic views showing the solar cell module of Example 9, wherein FIG. 15A is a schematic perspective view seen from the side of the light receiving surface, and FIG. 15B is a schematic cross-sectional view along a line 15B—15B in FIG. 15A.

A solar cell element 1c (with a refractive index of 2 in the surfacial layer) was composed of an amorphous silicon solar cell element with a flexible stainless steel substrate.

A front surface member 2c was composed of a reinforced white glass plate (refractive index 1.5), while a back surface member 3c was composed of a Japanese roof tile formed with a special shape as shown in FIGS. 15A and 15B. More specifically, a recess 36 for accommodating the solar cell element 1c is provided at the center of the back surface member 3c, while a restraining portion 37 for positioning the front surface member 2c and the adjoining member 12 is provided in an upper part, and a hole 47 for extracting the lead wire is provided at the center of the recess.

The adjoining member 12 was composed of an EPDM rectangular ring with a square cross-section.

Also as a soliLd layer 42 between the front surface member 2c and the solar cell element 1c, there was employed a crosslinked EVA sheet (refractive index 1.5).

At first, the solar cell element 1c connected in advance with the lead wire 10 was placed in the recess 36 of the back surface member 3c. The lead wire 10 was extracted through the hole 47 to the exterior of the solar cell module 4c, and a bushing 45 provided with a notch 84 was fitted on the lead wire 10 and was shifted thereon to mount on the hole 47. Then the solid layer 42 was placed on the solar cell element 1c, and the front surface member 2c was placed thereon. Finally, the adjoining member 12 was pressed into the gap between the end of the front surface member 2c and the restraining portion 37 to complete the solar cell module 4c integral with the roofing material of the Japanese roof tile shape.

The above-described solar cell module, being smooth on the surface and the same in shape as the commercially available Japanese roof tile, is excellent in design. It can also be worked in the same manner as or used in combination with ordinary Japanese roof tile.

Example 10

The present example relates to Embodiment 3 and is principally characterized by the use of an existing building roof as the front surface member.

Figure 16A:
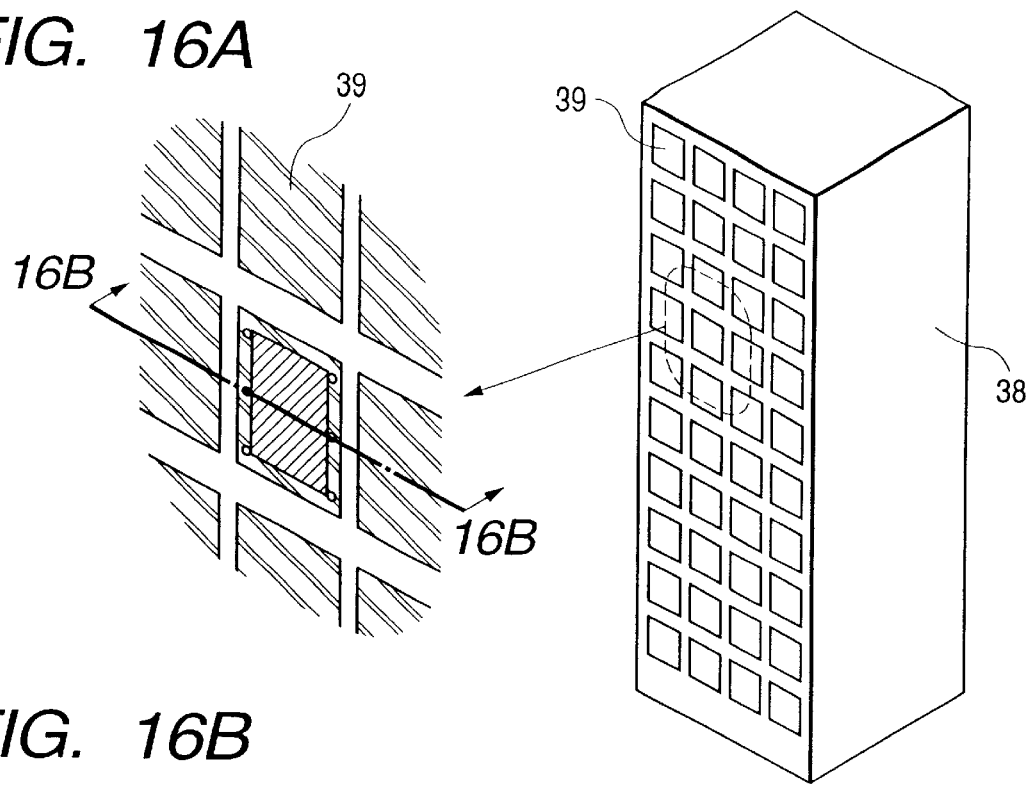
FIGS. 16A, 16B and 16C are schematic views of the solar cell module of Example 10.
Figure 16B:
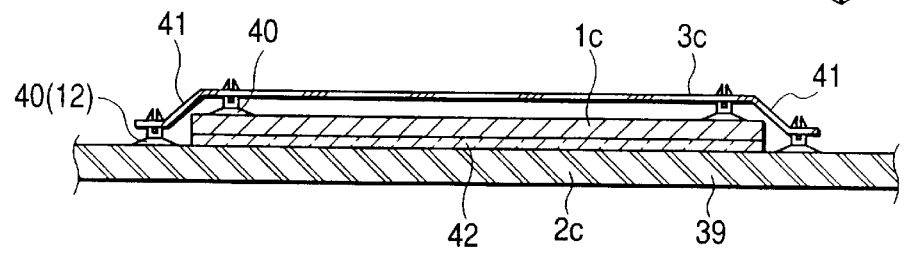
Figure 16C:
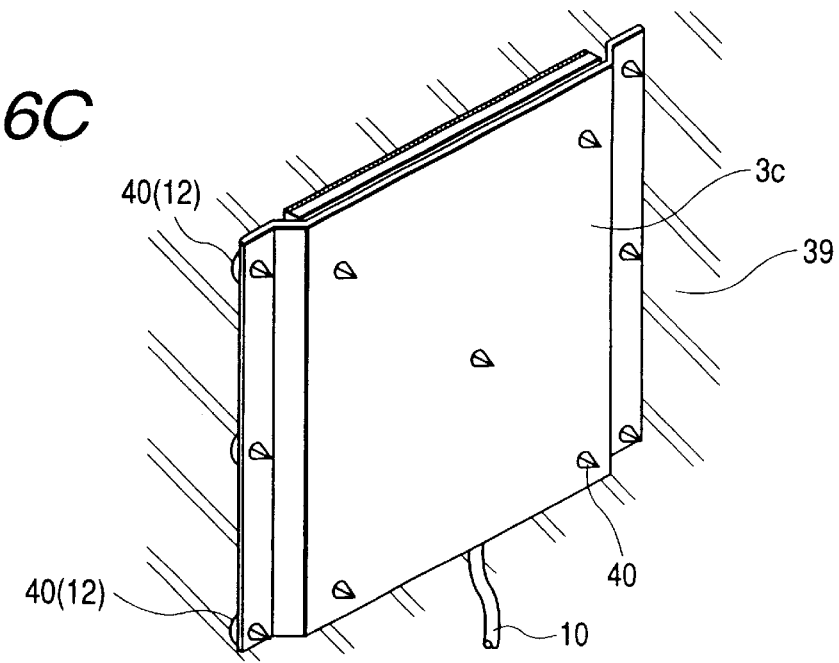

FIGS. 16A to 16C are schematic views showing the solar cell module of Example 10, wherein FIG. 16A shows mounting on a window 39 of a building 38, while FIG. 16B is a schematic cross-sectional view along a line 16B—16B in FIG. 16A, and FIG. 16C shows a mounting seen from the interior of the building 38.

A solar cell element 1c (with a refractive index of 2 in the surfacial layer) was composed of a crystalline silicon solar cell element which was connected in series to obtain the desired voltage.

A front surface member 2c was composed of the window 39 (refractive index 1.6) of the existing building 38, while a back surface member 3c was composed of a polycarbonate resin plate provided with plural detachable suction cups. The back surface member 3c was also provided with a spring portion 41 for pressing the solar cell element 1c to the front surface member 2c.

Among the suction cups 40 mounted on the back surface member 3c, those in contact with the solar cell element 1c serve to fix the same, while those in contact with the front surface member 2c serve as adjoining members 12.

Also a urethane resin sheet (refractive index 1.6) was employed as a solid layer 42 serving to eliminate the gap between the solar cell element 1c and the front surface member 2c and to prevent slippage therebetween.

At first, the solar cell element 1c connected in advance with the lead wire 10 was fixed to the suction cup for fixing the solar cell element 1c, then the solid layer 42 was placed on the solar cell element 1c, and the suction cup 40 for fixing with the front surface member 1c was mounted thereto. Thus, the solar cell element 1c and the solid layer 42 were pressed by the back surface member 3c to the front surface member 2c.

The above-described solar cell module can significantly reduce manufacturing cost, since the window glass of the existing building is used as the front surface member, and the application property can also be improved.

Also as it can be applied from the interior of the building, there can be realized excellent application property, maintenance property and collection property, and the cost can be further reduced since the waterproof structure can be simplified.

Example 11

The present example relates to Embodiment 4 and is principally characterized by the use of an inexpensive resin rod as the adjoining member and the use of waterproof means also for supporting the solar cell element.

Figure 17A:
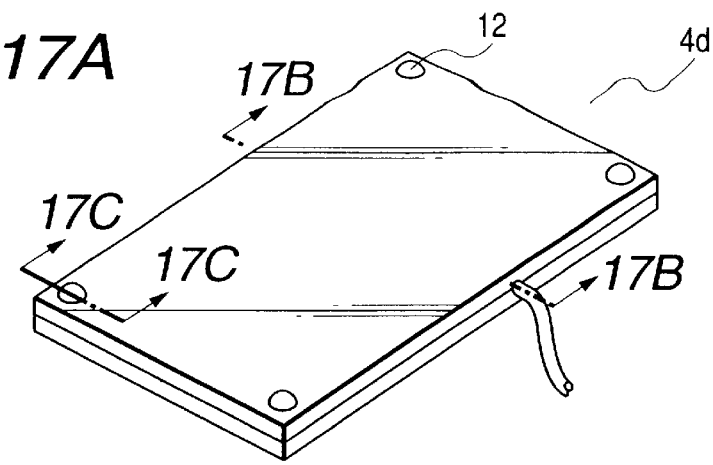
FIGS. 17A, 17B and 17C are schematic views of the solar cell module of Example 11.
Figure 17B:
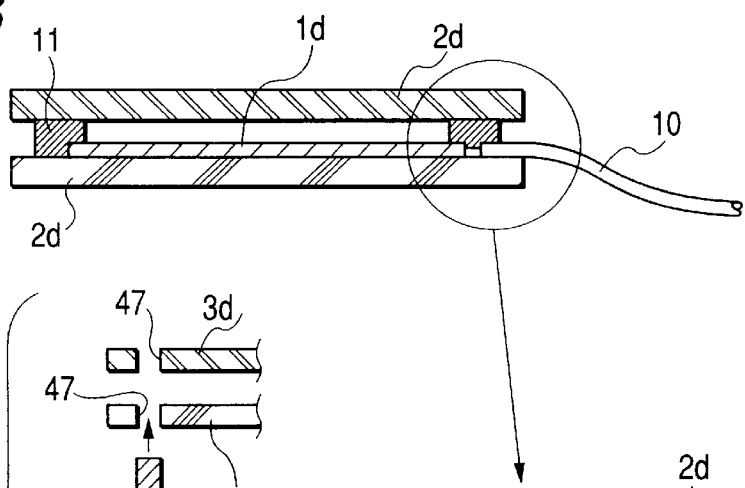
Figure 17C:
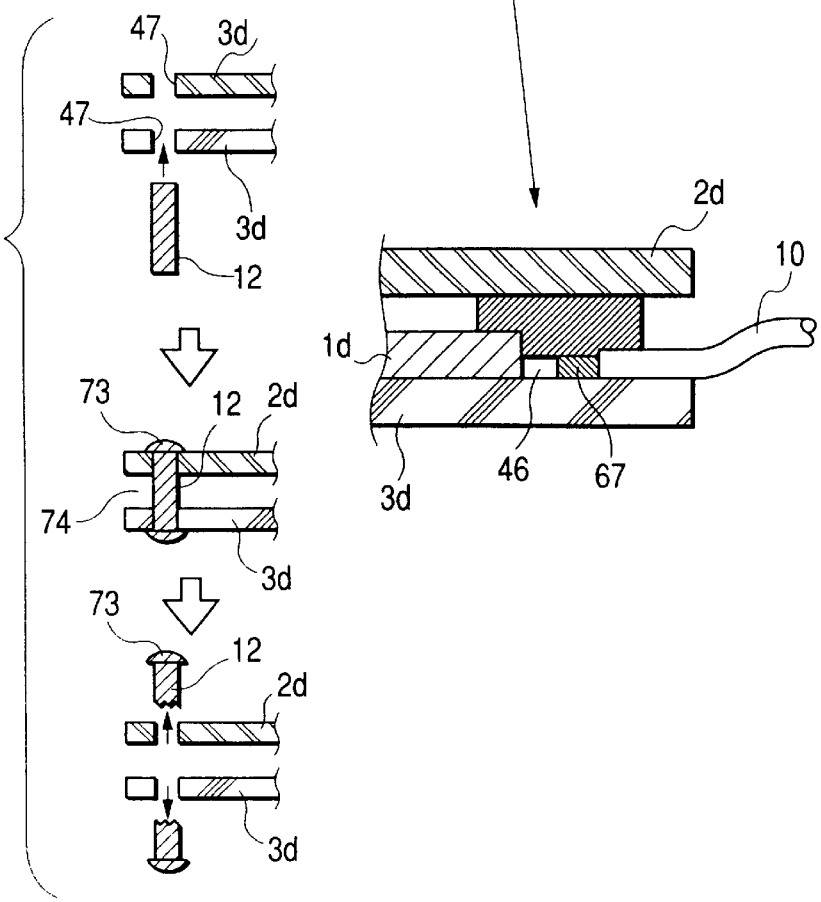

FIGS. 17A to 17C are schematic views showing the solar cell module of Example 11, wherein FIG. 17A is a schematic perspective view seen from the side of the light receiving surface, 17B is a schematic cross-sectional view along a line 17B—17B in FIG. 17A, and FIG. 17C is a partial sectional view showing a method of adjoining the front surface member and the back surface member and a state in which an adjoining member is cut.

A solar cell element 1d (with a refractive index of 2 in the surfacial layer) was composed of an amorphous silicon solar cell element connected in series to obtain the desired voltage.

A front surface member 2d and a back surface member 3d were composed of the same material (reinforced white glass plate) with the same shape and were provided with holes 47 for inserting an adjoining member 12.

The front surface member 2d was provided in advance with a surfacial layer containing a photocatalyst on a surface opposed to the solar cell element.

A water stopping member 11, for preventing water intrusion from the ends of the solar cell module 4d, was composed of foamed silicone rubber with independent pores.

An adjoining member 12 was composed of a rod of denatured PPE.

At first, as shown in the enlarged view of the encircled portion of FIG. 17B, on the back surface member 3d, a take-out electrode 46 formed as a tab was made to protrude at the side of the solar cell element 1d, and there was placed the solar cell element 1d of which the take-out electrode 46 was resistance welded to a contact 67 provided at the end of a lead wire 10. Then the water stopping member 11 was placed so as to partially superpose with the periphery of the solar cell element 1d, and the front surface member 2d was placed thereon.

Finally, the adjoining member 12 was inserted into the holes 47 of the front surface member 2d and the back surface member 3d, and the upper and lower ends of the adjoining member 12 was fused by ultrasonic fusion to form stopper portions 73, thereby completing the solar cell module 4d.

In addition to the above-described structure, it is also possible to form the take-out electrode of the solar cell element in a tab form protruding from the side of the solar cell element, to contact an end of the lead wire with such a protruding portion and to connect the end portions by resistance welding or ultrasonic welding, thereby achieving electric connection easily and securely and enabling easy classification upon disassembling by cutting such a welded portion.

The above-described solar cell module can adopt the back and front surface members of a simple form, such as a flat plate with a hole, or eventually a flat rectangular form, thereby further improving the manufacturing cost, classification/collection property and recycling property.

Also the simple structure wherein the solar cell element is pinched with the front and back surface members and with the water stopping member allows for the provision of a solar cell module of a low manufacturing cost.

Also the front and back surface members can be easily separated by inserting a screwdriver or the like into a gap 74 or by cutting the intermediate portion of the adjoining member, and the solar cell element, being merely pinched between the front and back surface members, can be easily taken out.

Also as the front and back surface members are composed of the same component, the initial light transmittance can be restored by interchanging the front and back surface members when the light transmittance is lowered by damage to the front surface member after prolonged use.

Furthermore, the solar cell element and the lead wire can be easily disassembled and separated without thermal influence on the solar cell element by cutting the welded portion of the take-out electrode and the contact.

In the solar cell module of the present invention, even when a part of the components is broken in prolonged outdoor use, it is possible to separate the broken component only, to collect and reuse the usable components.

Also after the use for the serviceable life, the solar cell module can be separated into the solar cell element, front surface member and back surface member, which can be easily classified and recycled.

In particular, the solar cell element having the longer service life and the higher manufacturing cost can be separated without the residues of other components, whereby a solar cell module of excellent recycling property can be provided.

What is claimed is:

1. A solar cell module comprising:
   a solar cell element;
   a solid layer provided in close contact with the light receiving surface side of said solar cell element;
   a front surface member provided in close contact with said solid layer; and
   a back surface member provided at the back surface side of said solar cell element,
   wherein said front surface member and said back surface member are adjoined in a releasable state; and
   said solar cell element, said solid layer, said front surface member and said back surface member can be separated without leaving residue of any of said front surface member, said back surface member or said solid layer on said solar cell element.

2. The solar cell module according to claim 1, wherein there stands a relation: refractive index of air≦refractive index of said front surface member≦refractive index of said solid layer≦refractive index of an outermost layer of said solar cell element.

3. The solar cell module according to claim 1, wherein said front surface member and said back surface member are composed of the same material.

4. The solar cell module according to claim 1, wherein said front surface member and said back surface member are composed of mutually soluble materials.

5. The solar cell module according to claim 1, wherein said front surface member and said back surface member have the same shape.

6. The solar cell module according to claim 1, wherein at least either of said front surface member and said back surface member is shaped as a flat rectangular plate.

7. The solar cell module according to claim 1, further comprising an adjoining releasing portion for releasing the adjoining of said front surface member and said back surface member.

8. The solar cell module according to claim 1, further comprising, between said front surface member and said solar cell element, an elastic sheet with light transmittance.

9. The solar cell module according to claim 1, wherein said solar cell element is flexible.

10. The solar cell module according to claim 1, wherein said front surface member and said back surface member are adjoined by mutual fitting.

11. The solar cell module according to claim 1, wherein the solid layer has elasticity.

12. The solar cell module according to claim 1, wherein a size of the solid layer is equal to or larger than that of the solar cell element.

13. A solar cell module comprising:
    a solar cell element;
    a front surface member provided at the light receiving surface side of said solar cell element; and
    a back surface member provided at the back surface side of said solar cell element,
    wherein said front surface member and said back surface member are adjoined in a releasable state;
    a photocatalyst is provided at least on a face of said front surface member opposed to said solar cell element; and
    said solar cell element, said front surface member and said back surface member can be separated without leaving residue of any of said front surface member or said back surface member on said solar cell element.

14. The solar cell module according to claim 13, wherein said front surface member and said back surface member are composed of the same material.

15. The solar cell module according to claim 13, wherein said front surface member and said back surface member are composed of mutually soluble materials.

16. The solar cell module according to claim 13, wherein said front surface member and said back surface member have the same shape.

17. The solar cell module according to claim 13, wherein at least either of said front surface member and said back surface member is shaped as a flat rectangular plate.

18. The solar cell module according to claim 13, further comprising an adjoining releasing portion for releasing the adjoining of said front surface member and said back surface member.

19. The solar cell module according to claim 13, wherein said solar cell element is flexible.

20. The solar cell module according to claim 13, wherein said front surface member and said back surface member are adjoined by mutual fitting.

21. A solar cell module comprising:
    a solar cell element;
    a solid layer provided in close contact with the light receiving surface side of said solar cell element;
    a front surface member provided in close contact with said solid layer;
    a back surface member provided at the back surface side of said solar cell element; and
    an adjoining member for adjoining said front surface member and said back surface member,
    wherein said front surface member and said back surface member are adjoined in a releasable state; and
    said solar cell element, said solid layer, said front surface member and said back surface member can be separated without leaving residue of any of said front surface member, said back surface member, said solid layer or said adjoining member on said solar cell element.

22. The solar cell module according to claim 21, wherein there stands a relation: refractive index of air≦refractive index of said front surface member≦refractive index of said solid layer≦refractive index of an outermost layer of said solar cell element.

23. The solar cell module according to claim 21, wherein said adjoining member is composed of a material the same as or mutually soluble with the material of said front or back surface member; and at the separation of said solar cell element, said front surface member and said back surface member, at least a part of said adjoining member is fixed solely on the same or mutually soluble material constituting said front or back surface member.

24. The solar cell module according to claim 21, wherein said front surface member and said back surface member are composed of the same material.

25. The solar cell module according to claim 21, wherein said front surface member and said back surface member are composed of mutually soluble materials.

26. The solar cell module according to claim 21, wherein said front surface member and said back surface member have the same shape.

27. The solar cell module according to claim 21, wherein at least either of said front surface member and said back surface member is shaped as a flat rectangular plate.

28. The solar cell module according to claim 21, further comprising, between said front surface member and said solar cell element, an elastic sheet with light transmittance.

29. The solar cell module according to claim 21, wherein said solar cell element is flexible.

30. The solar cell module according to claim 21, wherein the solid layer has elasticity.

31. The solar cell module according to claim 21, wherein a size of the solid layer is equal to or larger than that of the solar cell element.

32. A solar cell module comprising:

a solar cell element;

a front surface member provided at the light receiving surface side of said solar cell element;

a back surface member provided at the back surface side of said solar cell element; and an adjoining member for adjoining said front surface member and said back surface member, wherein said front surface member and said back surface member are adjoined by said adjoining member in a releasable state;

a photocatalyst is provided at least on a face of said front surface member opposed to said solar cell element; and said solar cell element, said front surface member and said back surface member can be separated without leaving residue of any of said front surface member, said back surface member or said adjoining member on the solar cell element.

33. The solar cell module according to claim 32, wherein said adjoining member is composed of a material the same as or mutually soluble with the material of said front or back surface member; and at the separation of said solar cell element, said front surface member and said back surface member, at least a part of said adjoining member is fixed solely on the same or mutually soluble material constituting said front or back surface member.

34. The solar cell module according to claim 32, wherein said front surface member and said back surface member are composed of the same material.

35. The solar cell module according to claim 32, wherein said front surface member and said back surface member are composed of mutually soluble materials.

36. The solar cell module according to claim 32, wherein said front surface member and said back surface member have the same shape.

37. The solar cell module according to claim 32, wherein at least either of said front surface member and said back surface member is shaped as a flat rectangular plate.

38. The solar cell module according to claim 32, wherein said solar cell element is flexible.

39. A power generating apparatus comprising a solar cell module according to any of claims 1 to 38 and a power converting device.

40. A separating method for a solar cell module, which comprises separating the solar cell module according to any of claims 1 to 38 to obtain the solar cell element.

41. A recycling method for a solar cell module comprising a step of preparing a solar cell module, utilizing the solar cell element obtained by the method according to claim 40, a front surface member and a back surface member.

* * * * *